(12) United States Patent
Hwang et al.

(10) Patent No.: US 12,362,253 B2
(45) Date of Patent: Jul. 15, 2025

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Hyeonjeong Hwang, Cheonan-si (KR); Dongkyu Kim, Anyang-si (KR); Minjung Kim, Cheonan-si (KR); Taewon Yoo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 17/859,411

(22) Filed: Jul. 7, 2022

(65) Prior Publication Data
US 2023/0105942 A1   Apr. 6, 2023

(30) Foreign Application Priority Data

Oct. 1, 2021   (KR) .................. 10-2021-0130866

(51) Int. Cl.
*H01L 23/34*   (2006.01)
*H01L 21/48*   (2006.01)
*H01L 21/56*   (2006.01)
*H01L 23/31*   (2006.01)
(Continued)

(52) U.S. Cl.
CPC .......... *H01L 23/34* (2013.01); *H01L 21/4853* (2013.01); *H01L 21/56* (2013.01); *H01L 23/3135* (2013.01); *H01L 23/49811* (2013.01); *H01L 23/49822* (2013.01); *H01L 24/16* (2013.01); *H01L 2224/16227* (2013.01)

(58) Field of Classification Search
CPC ............ H01L 23/34; H01L 23/36–367; H01L 23/3675; H01L 23/3677; H01L 23/3735–3736; H01L 23/16–18; H01L 23/28; H01L 23/31–3135; H01L 21/4853; H01L 23/49811; H01L 23/528; H01L 23/5386
See application file for complete search history.

(56) References Cited

U.S. PATENT DOCUMENTS 10,593,629 B2   3/2020   Chiang et al.
10,916,488 B2   2/2021   Lin et al.
11,031,375 B2   6/2021   Lee et al.
(Continued)

FOREIGN PATENT DOCUMENTS

KR   10-2017-0070779   6/2017
KR   10-2023-0044059   4/2023

*Primary Examiner* — Evan G Clinton
(74) *Attorney, Agent, or Firm* — MORGAN, LEWIS & BOCKIUS LLP

(57) ABSTRACT

A semiconductor package includes: a package substrate; a first semiconductor chip disposed on the package substrate; a heat-dissipation pattern disposed on the first semiconductor chip; a first mold layer disposed on the package substrate and at least partially surrounding the first semiconductor chip and the heat-dissipation pattern; a redistribution layer disposed on the first mold layer; a penetration electrode penetrating the first mold layer and coupled to the package substrate; and a connection pattern disposed on the penetration electrode, and connecting the redistribution layer to the penetration electrode, wherein a top surface of the heat-dissipation pattern and a top surface of the connection pattern are exposed by the first mold layer.

20 Claims, 21 Drawing Sheets

(51) Int. Cl.
  *H01L 23/498* (2006.01)
  *H01L 23/00* (2006.01)

(56) References Cited

U.S. PATENT DOCUMENTS

| | | |
|---|---|---|
| 2017/0207205 A1* | 7/2017 | Kim ........................ H01L 24/20 |
| 2019/0164893 A1* | 5/2019 | Kim .................. H01L 23/49827 |
| 2019/0189549 A1* | 6/2019 | Jo ....................... H01L 23/5389 |
| 2019/0237382 A1 | 8/2019 | Kim et al. |
| 2019/0252290 A1* | 8/2019 | Nishimura .............. H01L 23/13 |
| 2020/0211938 A1 | 7/2020 | Park et al. |
| 2020/0373216 A1 | 11/2020 | Yoo et al. |
| 2021/0280507 A1* | 9/2021 | Aldrete ................. H01L 21/568 |
| 2022/0367373 A1* | 11/2022 | Chen ....................... H01L 24/96 |
| 2023/0101149 A1 | 3/2023 | Yoo et al. |

\* cited by examiner

SEMICONDUCTOR PACKAGE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2021-0130866, filed on Oct. 1, 2021, in the Korean Intellectual Property Office, the disclosure of which is incorporated by reference herein in its entirety.

TECHNICAL FIELD

The present inventive concept relates to a semiconductor package and a method of fabricating the same, and in particular, to a semiconductor package, in which a plurality of semiconductor chips are provided, and a method of fabricating the same.

DISCUSSION OF THE RELATED ART

In the case where an integrated circuit (IC) chip is provided in the form of a semiconductor package, the IC chip can be used as a part of an electronic product. In general, the semiconductor package includes a printed circuit board (PCB) and a semiconductor chip, which is mounted on the PCB and is electrically connected to the PCB by bonding wires or bumps.

In the semiconductor industry, there is an increasing desire for semiconductor devices, which have relatively high-performance, relatively high-speed, and relatively compact size, and electronic products including the semiconductor devices. To meet such desires, technologies of stacking multiple semiconductor chips on a single substrate or stacking a semiconductor package on another semiconductor package have been suggested. For example, a package-on-package (PoP) technology of vertically stacking semiconductor chips has been suggested to realize a high-density chip stacking structure. According to the PoP technology, it is possible to integrate various semiconductor chips within a small area, compared with a general packaging structure composed of a single semiconductor chip. However, regarding the PoP technology, it is difficult to construct a wiring structure or to exhaust heat generated by the semiconductor chips, because a plurality of semiconductor chips are integrated on a single package.

SUMMARY

According to an example embodiment of the present inventive concept, a semiconductor package includes: a package substrate; a first semiconductor chip disposed on the package substrate; a heat-dissipation pattern disposed on the first semiconductor chip; a first mold layer disposed on the package substrate and at least partially surrounding the first semiconductor chip and the heat-dissipation pattern; a redistribution layer disposed on the first mold layer; a penetration electrode penetrating the first mold layer and coupled to the package substrate; and a connection pattern disposed on the penetration electrode, and connecting the redistribution layer to the penetration electrode, wherein a top surface of the heat-dissipation pattern and a top surface of the connection pattern are exposed by the first mold layer.

According to an example embodiment of the present inventive concept, a semiconductor package includes: a package substrate; a first semiconductor chip disposed on the package substrate; a redistribution layer disposed on the first semiconductor chip; a first metal pattern disposed between the first semiconductor chip and the redistribution layer; a first seed/barrier layer interposed between the first semiconductor chip and the first metal pattern; a first mold layer disposed on the package substrate and at least partially surrounding the first semiconductor chip; a second mold layer disposed on the first mold layer and at least partially surrounding the first metal pattern; a vertical connection terminal provided at a side of the first semiconductor chip and penetrating the first mold layer and the second mold layer, wherein the vertical connection terminal connects the package substrate to the redistribution layer, and outer terminals disposed on a bottom surface of the package substrate, wherein a top surface of the first mold layer is coplanar with a top surface of the first semiconductor chip, and a top surface of the second mold layer is coplanar with a top surface of the first metal pattern.

According to an example embodiment of the present inventive concept, a method of fabricating a semiconductor package includes: mounting a semiconductor chip on a package substrate; forming a penetration electrode on the package substrate; forming a first mold layer on the package substrate, the semiconductor chip, and the penetration electrode; performing a first planarization process on the first mold layer such that a first surface of the semiconductor chip and a first surface of the penetration electrode are exposed; forming a metal pattern on the first mold layer, wherein the metal pattern includes a heat-dissipation pattern and a connection pattern, wherein the heat-dissipation pattern is placed on the first surface of the semiconductor chip, and the connection pattern is placed on the penetration electrode; forming a second mold layer on the first mold layer, the heat-dissipation pattern and the connection pattern; performing a second planarization process on the second mold layer such that a first surface of the heat-dissipation pattern and a first surface of the connection pattern are exposed; and forming a redistribution layer, which is coupled to the connection pattern, on the second mold layer.

DETAILED DESCRIPTION OF THE EMBODIMENTS

Example embodiments of the present inventive concept will now be described more fully with reference to the accompanying drawings.

Figure 1:
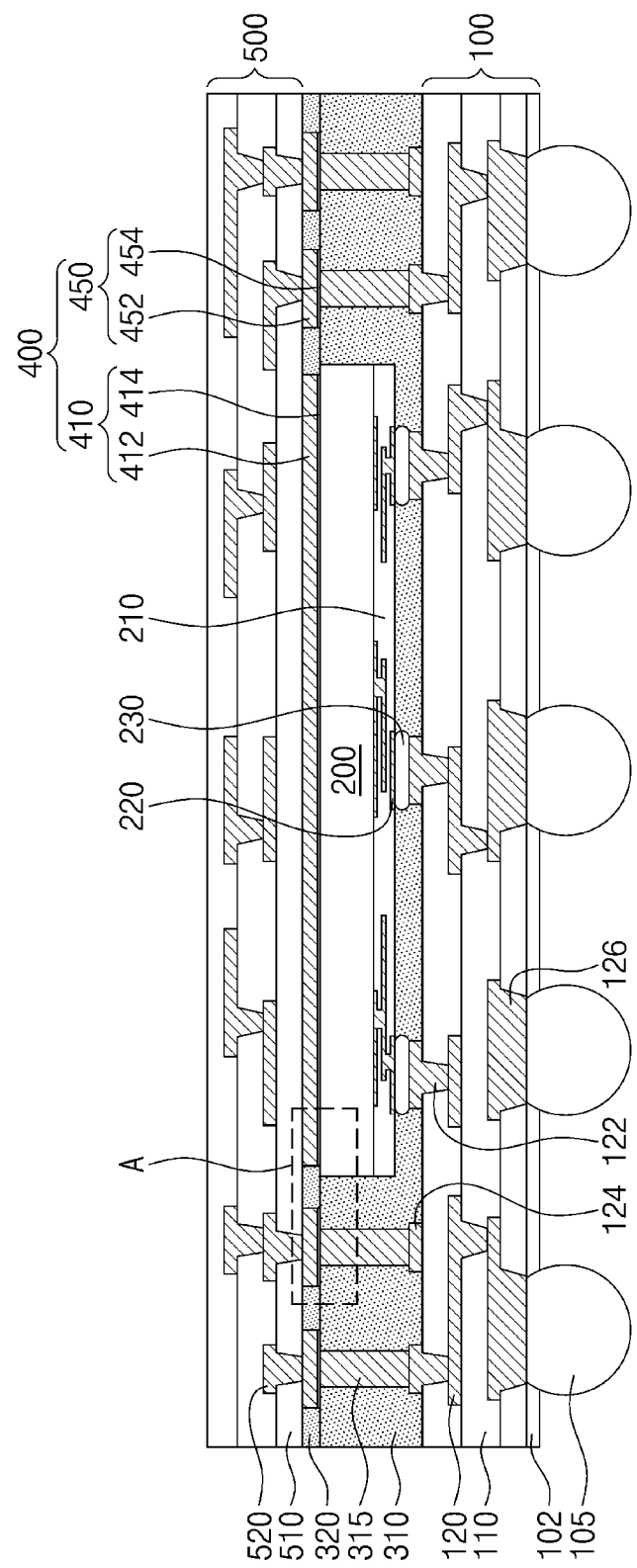
FIG. 1 is a sectional view illustrating a semiconductor package according to an example embodiment of the present inventive concept.
Figure 2:
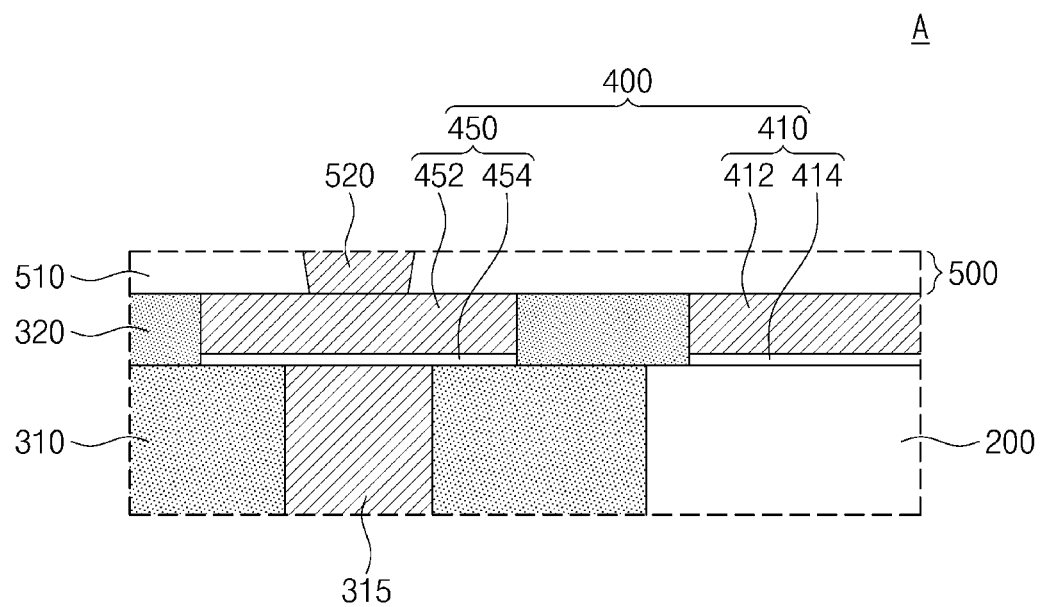
FIGS. 2 and 3 are enlarged sectional views each illustrating a portion 'A' of FIG. 1.
Figure 3:
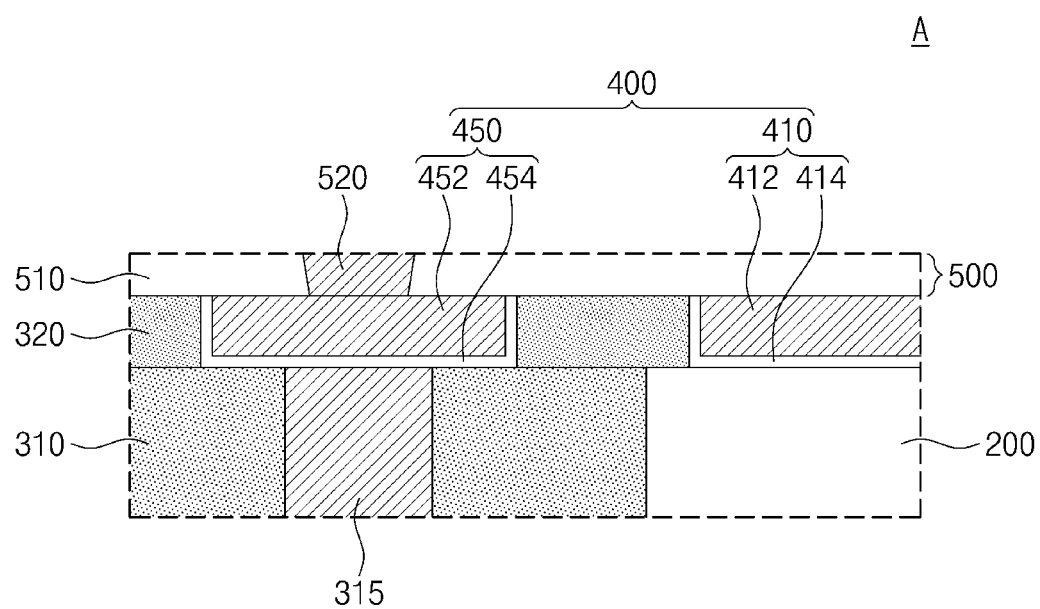

FIG. 1 is a sectional view illustrating a semiconductor package according to an example embodiment of the inventive concept. FIGS. 2 and 3 are enlarged sectional views each illustrating a portion 'A' of FIG. 1. FIGS. 4 to 7 are plan views illustrating a semiconductor package according to an example embodiment of the inventive concept, or in particular, a planar shape of a heat-dissipation pattern.

Referring to FIGS. 1 and 2, a semiconductor package may include a package substrate 100, a first semiconductor chip 200, first and second mold layers 310 and 320, a penetration electrode 315, a metal pattern 400, and a redistribution layer 500.

The package substrate 100 may be provided. The package substrate 100 may be a redistribution substrate. The package substrate 100 may include one or more first substrate interconnection layers which are stacked on top of each other. Each of the first substrate interconnection layers may include a first substrate insulating layer 110 and a first substrate interconnection pattern 120 in the first substrate insulating layer 110. The substrate interconnection pattern 120 of one of the first substrate interconnection layers may be electrically connected to the first substrate interconnection pattern 120 of an adjacent first substrate interconnection layer of the first substrate interconnection layers. Hereinafter, a structure of the package substrate 100 will be described in more detail with reference to one of the first substrate interconnection layers.

The first substrate insulating layer 110 may include an insulating polymer or a photo-imageable dielectric (PID). For example, the photo-imageable dielectric may include at least one of photo-imageable polyimide (PI), polybenzoxazole (PBO), phenol-based polymers, or benzocyclobutene-based polymers. In addition, the first substrate insulating layer 110 may include an insulating material. For example, the first substrate insulating layer 110 may be formed of or include at least one of silicon oxide (SiO), silicon nitride (SiN), silicon oxynitride (SiON), and/or insulating polymers.

The first substrate interconnection pattern 120 may be provided on the first substrate insulating layer 110. The first substrate interconnection pattern 120 may be horizontally extended on the first substrate insulating layer 110. The first substrate interconnection pattern 120 may be an element that is provided for redistribution on the first substrate interconnection layer. The first substrate interconnection pattern 120 may include a conductive material. For example, the first substrate interconnection pattern 120 may be formed of or include copper (Cu).

The first substrate interconnection pattern 120 may have a damascene structure. For example, the first substrate interconnection pattern 120 may have a head portion and a tail portion which are connected to form a single object. The head and tail portions may be provided to have no interface therebetween. Here, a width of the head portion, which is connected to the tail portion, may be larger than a width of the tail portion. Thus, the head and tail portions of the first substrate interconnection pattern 120 may form a 'T'-shape.

The head portion of the first substrate interconnection pattern 120 may be a wire or pad portion which is used to horizontally expand an interconnection line in the package substrate 100. The head portion may be provided on a top surface of the first substrate insulating layer 110. For example, the head portion may protrude above the top surface of the first substrate insulating layer 110. The head portion of the first substrate interconnection pattern 120 of the uppermost one of the first substrate interconnection layers may correspond to first substrate pads 122, which are used to mount the first semiconductor chip 200 on the package substrate 100, and a second substrate pad 124, to which the penetration electrode 315 is coupled.

The tail portion of the first substrate interconnection pattern 120 may be a via portion vertically connecting interconnection lines in the package substrate 100 to each other. The tail portion may be connected to a bottom surface of the head portion. The tail portion may be coupled to another first substrate interconnection layer thereunder. For example, the tail portion of the first substrate interconnection pattern 120 may be extended from the bottom surface of the head portion to penetrate the first substrate insulating layer 110 and may be coupled to the head portion of the first substrate interconnection pattern 120 of the other first substrate interconnection layer, that is thereunder. The tail portion of the first substrate interconnection pattern 120 of the lowermost one of the first substrate interconnection layers may be exposed to the outside of the first substrate insulating layer 110 near a bottom surface of the first substrate insulating layer 110. The tail portion of the first substrate interconnection pattern 120, which is exposed to the outside of the lowermost one of the first substrate insulating layers 110, may correspond to under-bump pads 126, which are used to connect outer terminals 105 to the package substrate 100.

A protection layer 102 may be provided below the lowermost one of the first substrate interconnection layers. The protection layer 102 may cover the bottom surface of the lowermost one of the first substrate insulating layer 110. The protection layer 102 may be configured to protect a bottom surface of the package substrate 100. Here, the under-bump pads 126 may be exposed to the outside by the protection layer 102 through a recess formed in the protection layer 102. The recess may be an empty region, in which the outer terminal 105 is provided. The protection layer 102 may include an insulating material. For example, the protection layer 102 may be formed of or include at least one of silicon oxide (SiO), silicon nitride (SiN), silicon oxynitride (SiON), and/or insulating polymers.

The outer terminals 105 may be disposed below the package substrate 100. For example, the outer terminals 105 may be disposed on the under-bump pads 126, which are disposed near the bottom surface of the package substrate 100. For example, the outer terminals 105 may be placed in the recesses, which are formed in the protection layer 102, and may be coupled to bottom surfaces of the under-bump pads 126. For example, outer terminals 105 may include solder balls or solder bumps, and according to the kind or arrangement of the outer terminals 105, the semiconductor package may have a ball grid array (BGA) structure, a fine ball-grid array (FBGA) structure, or a land grid array (LGA) structure.

The first semiconductor chip 200 may be disposed on the package substrate 100. For example, the first semiconductor chip 200 may be disposed on a top surface of the package substrate 100. For example, the first semiconductor chip 200 may include a memory chip or a logic chip. In addition, the first semiconductor chip 200 may include a passive element. The first semiconductor chip 200 may be disposed on the package substrate 100 in a face-down manner. For example, the first semiconductor chip 200 may have a front surface, which faces the package substrate 100, and a rear surface, which is opposite to the front surface. Hereinafter, in the present specification, the front surface may be a surface of a semiconductor chip, which is called an active surface, and on which integrated devices or pads may be formed. In addition, the rear surface may be another surface of a semiconductor chip that is opposite to the front surface. According to the afore-described positions of the package substrate 100 and the first semiconductor chip 200, a bottom surface of the first semiconductor chip 200 may correspond to the front surface of the first semiconductor chip 200, and a top surface of the first semiconductor chip 200 may correspond to the rear surface of the first semiconductor chip 200. The first semiconductor chip 200 may be formed of or include a semiconductor material (e.g., silicon (Si)). The first semiconductor chip 200 may include a first circuit layer 210, which is provided near the bottom surface of the first semiconductor chip 200 and is facing the package substrate 100.

The first circuit layer 210 may be provided near the front surface of the first semiconductor chip 200. The first circuit layer 210 may be electrically connected to integrated devices or integrated circuits, which are formed in the first semiconductor chip 200. The first semiconductor chip 200 may have first chip pads 220, which are provided on the bottom surface of the first semiconductor chip 200. The first chip pads 220 may be electrically connected to the integrated devices or the integrated circuits in the first semiconductor chip 200 through the first circuit layer 210.

The first semiconductor chip 200 may be mounted on the package substrate 100. For example, the first semiconductor chip 200 may be mounted on the package substrate 100 in a flip-chip manner. For example, the first semiconductor chip 200 may be provided such that the first circuit layer 210 faces the package substrate 100. Here, first chip terminals 230 may be provided below the first chip pads 220 of the first semiconductor chip 200. The first semiconductor chip 200 may be mounted on the package substrate 100 through the first chip terminals 230. The first chip terminals 230 may connect the first chip pads 220 of the first semiconductor chip 200 to the first substrate pads 122 of the package substrate 100.

The first mold layer 310 may be provided on the package substrate 100. The first mold layer 310 may cover the top surface of the package substrate 100. The first mold layer 310 may be provided to at least partially enclose the first semiconductor chip 200, when viewed in a plan view. The first mold layer 310 may be provided to cover a side surface of the first semiconductor chip 200 and to expose the top surface (e.g., a rear surface) of the first semiconductor chip 200. For example, a top surface of the first mold layer 310 may be coplanar with the top surface of the first semiconductor chip 200; however, the present inventive concept is not limited thereto. Here, the top surface of the first mold layer 310 and the top surface of the first semiconductor chip 200 may be flat. For example, the top surface of the first mold layer 310 and the top surface of the first semiconductor chip 200 may be located on the same plane. The first mold layer 310 may fill a space between the package substrate 100 and the first semiconductor chip 200. The first mold layer 310 may be provided to at least partially enclose the first chip terminals 230 that are disposed between the package substrate 100 and the first semiconductor chip 200. The first mold layer 310 may be formed of or include an insulating material (e.g., an epoxy molding compound (EMC)).

At least one penetration electrode 315 may be provided on the package substrate 100. The penetration electrode 315 may be horizontally spaced apart from the first semiconductor chip 200. The penetration electrode 315 may be provided to vertically penetrate the first mold layer 310. An end portion of the penetration electrode 315 may be extended toward the package substrate 100 and may be coupled to the second substrate pad 124 of the package substrate 100. Another end portion of the penetration electrode 315 may be exposed by the first mold layer 310 near the top surface of the first mold layer 310. For example, a top surface of the penetration electrode 315 may be substantially coplanar with the top surface of the first mold layer 310; however, the present inventive concept is not limited thereto. Here, the top surface of the first mold layer 310 and the top surface of the penetration electrode 315 may be substantially flat. For example, the top surface of the first mold layer 310 and the top surface of the penetration electrode 315 may be located on the same plane. For example, the top surface of the first mold layer 310, the top surface of the first semiconductor chip 200, and the top surface of the penetration electrode 315 may be substantially coplanar with each other. The penetration electrode 315 may be shaped like a circular or polygonal pillar and may be provided to vertically penetrate the first mold layer 310. A width of the penetration electrode 315 may be substantially constant, regardless of a distance from the package substrate 100. In addition, a width of the penetration electrode 315 may decrease as a distance to the package substrate 100 decreases. In an example embodiment of the present inventive concept, a plurality of the penetration electrodes 315 may be provided. In this case, the semiconductor package may include a plurality of second substrate pads 124, each of which is coupled to a corresponding one of the penetration electrodes 315. The penetration electrode 315 may include at least one of metallic materials. For example, the penetration electrode 315 may be formed of or include copper (Cu).

In the present specification, the term 'penetration electrode' may be an electrode, which is provided to vertically penetrate an element, and the present inventive concept is not limited to a specific planar shape of the penetration electrode. For example, the penetration electrode may be provided in the form of a circular pillar (e.g., a cylinder), a polygonal pillar, a partition, or a wall.

The metal pattern 400 may be provided on the first semiconductor chip 200 and the first mold layer 310. The metal pattern 400 may include a heat-dissipation pattern 410, which is provided on the first semiconductor chip 200, and a connection pattern 450, which is provided on the first mold layer 310.

The heat-dissipation pattern 410 may be provided on the top surface of the first semiconductor chip 200. The heat-dissipation pattern 410 may be configured to effectively transfer heat, which is produced in the first semiconductor chip 200, to the redistribution layer 500. As an example, the heat-dissipation pattern 410 may be in direct contact with the top surface of the first semiconductor chip 200. The heat-dissipation pattern 410 may have a first metal pattern 412, which is formed of a metallic material of high thermal conductivity. In an example embodiment of the present inventive concept, the first metal pattern 412 may be formed of or include copper (Cu). The heat-dissipation pattern 410 may further include a first seed/barrier layer 414, which is interposed between a bottom surface of the first metal pattern 412 and the top surface of the first semiconductor chip 200. The first seed/barrier layer 414 may cover the bottom surface of the first metal pattern 412. As shown in FIG. 2, the first seed/barrier layer 414 may be provided to expose a side surface of the first metal pattern 412. A width of the first seed/barrier layer 414 may be substantially equal to a width of the first metal pattern 412. In addition, as shown in FIG. 3, the first seed/barrier layer 414 may be extended from the bottom surface of the first metal pattern 412 to the side surface of the first metal pattern 412. In other words, the bottom and side surfaces of the first metal pattern 412 may be covered with the first seed/barrier layer 414. The first seed/barrier layer 414 may be formed of or include at least one of metallic materials (e.g., gold (Au), titanium (Ti), or tantalum (Ta)). In addition, the first seed/barrier layer 414 may be formed of or include at least one of metal nitride materials (e.g., titanium nitride (TiN) and/or tantalum nitride (TaN)).

A planar area of the heat-dissipation pattern 410 may be smaller than a planar area of the first semiconductor chip 200. A width of the heat-dissipation pattern 410 may be smaller than a width of the first semiconductor chip 200. The entirety of the heat-dissipation pattern 410 may be vertically overlapped with the first semiconductor chip 200. For example, edge portions of the first semiconductor chip 200 may be exposed by the heat-dissipation pattern 410.

Figure 4:
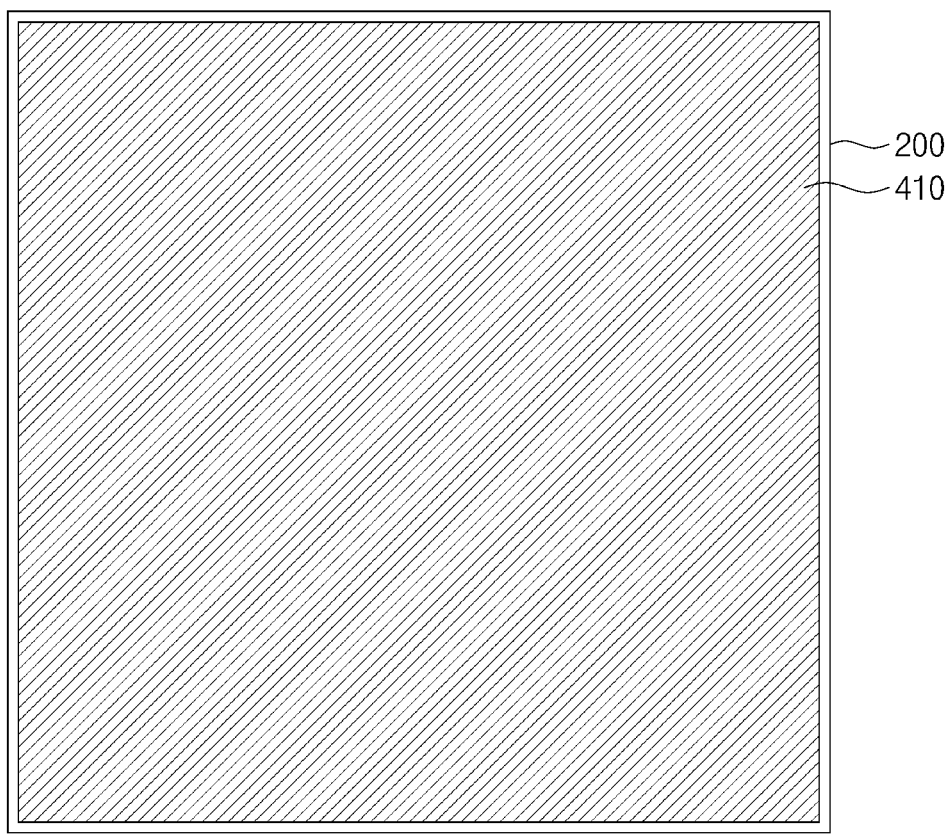
FIGS. 4, 5, 6 and 7 are plan views illustrating a semiconductor package according to an example embodiment of the present inventive concept.

As shown in FIG. 4, the heat-dissipation pattern 410 may be provided in the form of a plate. Here, the planar area of the heat-dissipation pattern 410 may be equal or similar to the planar area of the first semiconductor chip 200. For example, the heat-dissipation pattern 410 may have a square or rectangular shape, when viewed in a plan view. However, the present inventive concept is not limited to this example, and the planar shape of the heat-dissipation pattern 410 may be variously changed depending on the shape of the first semiconductor chip 200.

Figure 5:
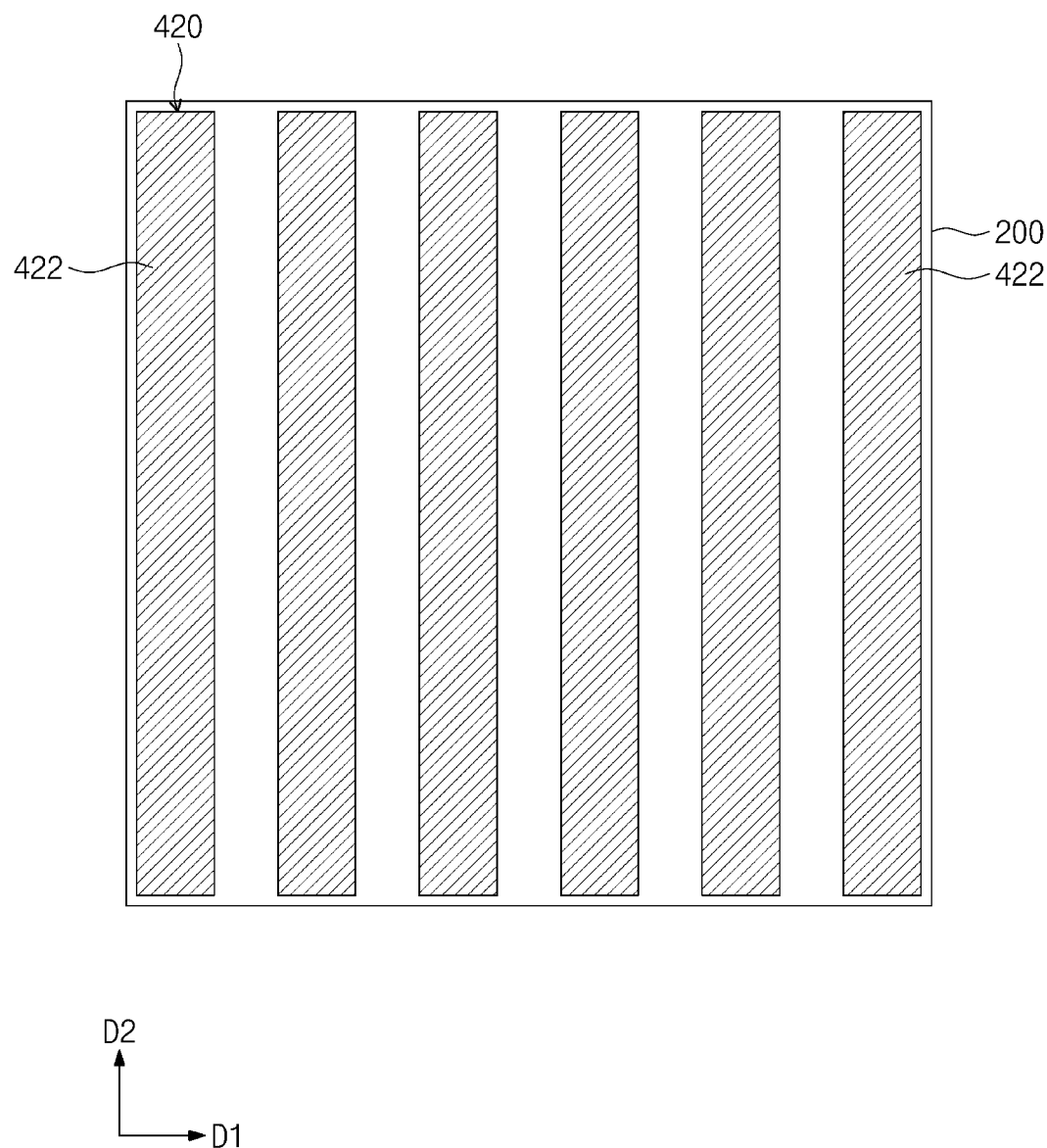

In an example embodiment of the present inventive concept, as shown in FIG. 5, a heat-dissipation pattern 420 may include a plurality of line-shaped portions. For example, the heat-dissipation pattern 420 may include a plurality of line patterns 422. The line patterns 422 may be provided on the top surface of the first semiconductor chip 200, and may be extended in a second direction D2. In addition, the line patterns 422 may be spaced apart from each other in a first direction D1. Here, the first and second directions D1 and D2 may be two orthogonal directions that are parallel to the top surface of the first semiconductor chip 200.

Figure 6:
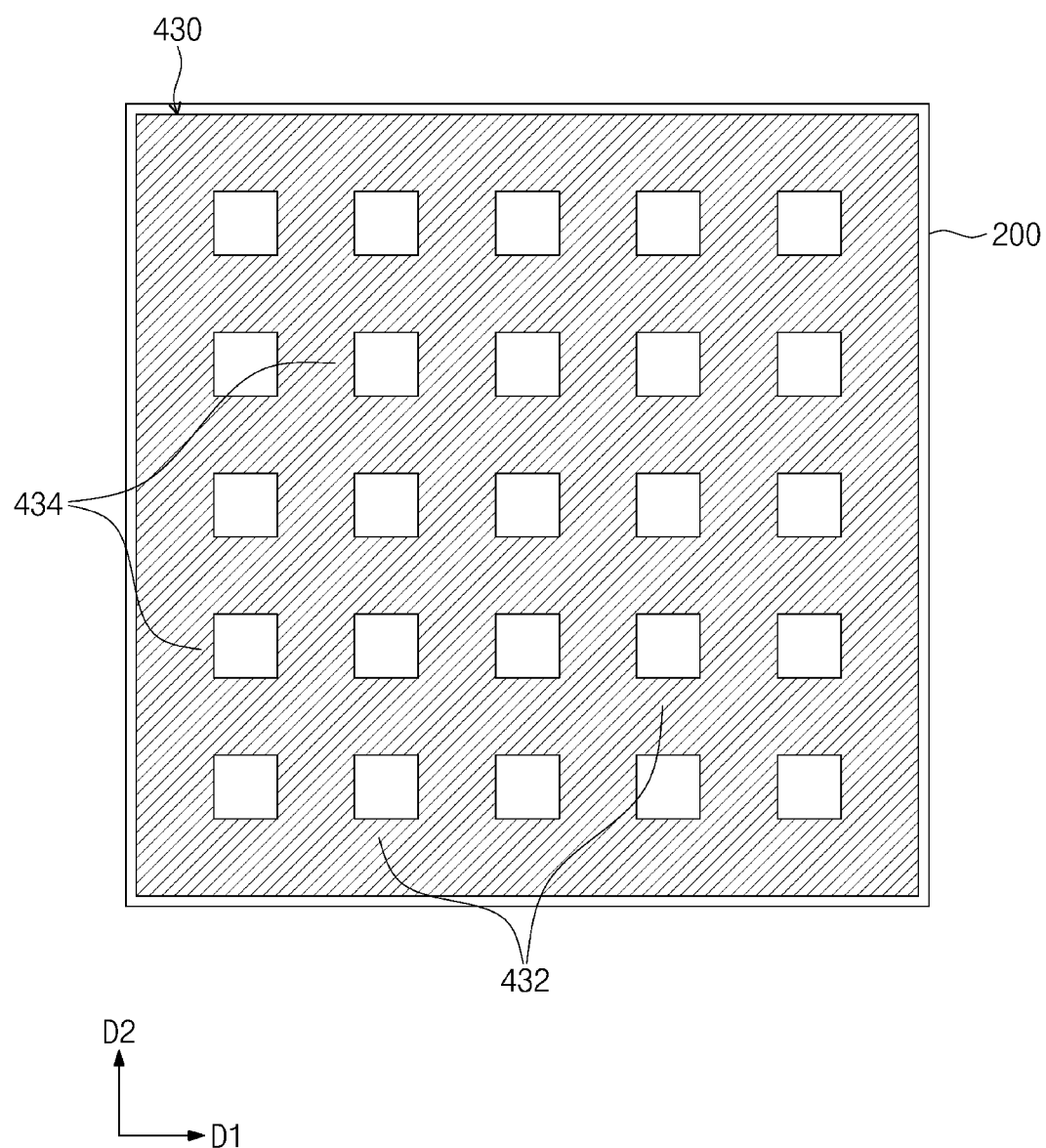

In an example embodiment of the present inventive concept, as shown in FIG. 6, a heat-dissipation pattern 430 may have a mesh shape. For example, the heat-dissipation pattern 430 may have first line patterns 432 and second line patterns 434. The first line patterns 432 may be provided on the top surface of the first semiconductor chip 200, and may be extended in the first direction D1. In addition, the first line patterns 432 may be spaced apart from each other in the second direction D2. The second line patterns 434 may be provided on the top surface of the first semiconductor chip 200, and may be extended in the second direction D2. In addition, the second line patterns 434 may be spaced apart from each other in the first direction D1. The first line patterns 432 and the second line patterns 434 may be disposed to cross each other and thereby to form a mesh shape.

Figure 7:
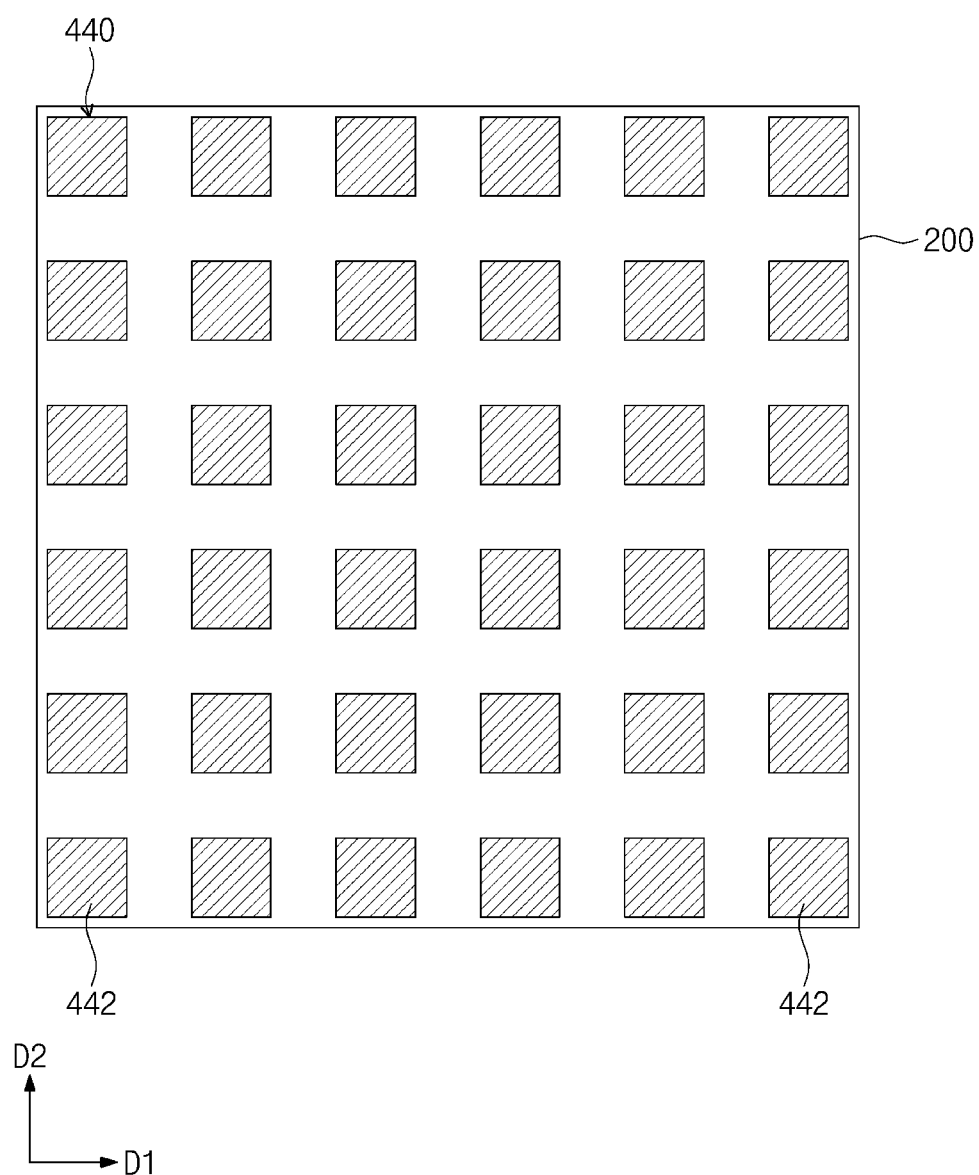

In an example embodiment of the present inventive concept, as shown in FIG. 7, a heat-dissipation pattern 440 may include a plurality of island-shaped portions. For example, the heat-dissipation pattern 440 may include a plurality of island patterns 442. The island patterns 442 may be provided on the top surface of the first semiconductor chip 200 and may be arranged to be spaced apart from each other in the first and second directions D1 and D2. For example, each of the island patterns 442 may have a polygonal shape or a circular shape. FIG. 7 illustrates an example, in which the island patterns 442 are arranged in two orthogonal directions (e.g., the first and second directions D1 and D2) or in a grid shape, but the present inventive concept is not limited to this example. For example, the island patterns 442 may be arranged in one of other various shapes (e.g., a honeycomb shape).

Hereinafter, the present inventive concept will be described in more detail with reference to an example embodiment of FIG. 4.

According to an example embodiment of the present inventive concept, the heat-dissipation pattern 410, which is formed of a metallic material of high thermal conductivity, may be provided on the top surface of the first semiconductor chip 200. Thus, heat, which is generated in the first semiconductor chip 200, may be easily transferred to the redistribution layer 500 through the heat-dissipation pattern 410, and thus, the semiconductor package may have high heat-dissipation efficiency.

Referring further to FIGS. 1 and 2, the connection pattern 450 may be provided on the top surface of the penetration electrode 315. The connection pattern 450 may be configured to electrically connect the penetration electrode 315 to the redistribution layer 500. As an example, the connection pattern 450 may be in direct contact with the top surface of the penetration electrode 315. The connection pattern 450 may have a second metal pattern 452, which is formed of the same material as the first metal pattern 412. As an example, the second metal pattern 452 may be formed of or include copper (Cu). The connection pattern 450 may further include a second seed/barrier layer 454, which is interposed between a bottom surface of the second metal pattern 452 and the top surface of the penetration electrode 315. The second seed/barrier layer 454 may cover at least a portion of the bottom surface of the second metal pattern 452. As shown in FIG. 2, the second seed/barrier layer 454 may expose a side surface of the second metal pattern 452. A width of the second seed/barrier layer 454 may be substantially equal to a width of the second metal pattern 452. In addition, as shown in FIG. 3, the second seed/barrier layer 454 may be extended from the bottom surface of the second metal pattern 452 to the side surface of the second metal pattern 452. In other words, the bottom and side surfaces of the second metal pattern 452 may be at least partially covered with the second seed/barrier layer 454. The second seed/barrier layer 454 may be formed of or include at least one of metallic materials (e.g., gold (Au), titanium (Ti) and/or tantalum (Ta)). In addition, the second seed/barrier layer 454 may be formed of or include at least one metal nitride material (e.g., titanium nitride (TiN) or tantalum nitride (TaN)). For example, the penetration electrode 315, the second metal pattern 452, and the second seed/barrier layer 454 may form a vertical connection terminal penetrating the first mold layer 310 and the second mold layer 320.

A planar area of the connection pattern 450 may be larger than a planar area of the penetration electrode 315. A width of the connection pattern 450 may be larger than a width of the penetration electrode 315. The connection pattern 450 may vertically overlap the entirety of the penetration electrode 315. For example, the connection pattern 450 may cover the entire top surface of the penetration electrode 315. A top surface of the connection pattern 450 may be provided at the same level as a top surface of the heat-dissipation pattern 410. In the case where a plurality of penetration electrodes 315 are provided, the connection pattern 450 may also be provided in plural, and in this case, each of the connection patterns 450 may be connected to a corresponding penetration electrode 315 of the penetration electrodes 315.

The second mold layer 320 may be provided on the first mold layer 310. The second mold layer 320 may cover the top surface of the first mold layer 310. The second mold layer 320 may be provided to enclose the metal pattern 400, when viewed in a plan view. For example, the second mold layer 320 may cover a side surface of the heat-dissipation pattern 410 and a side surface of the connection pattern 450 and may expose the top surface of the heat-dissipation pattern 410 and the top surface of the connection pattern 450. An interface between the first mold layer 310 and the second mold layer 320 may be provided on the same plane as an interface between the first semiconductor chip 200 and the heat-dissipation pattern 410 and an interface between the penetration electrode 315 and the connection pattern 450. A top surface of the second mold layer 320, the top surface of the heat-dissipation pattern 410, and the top surface of the connection pattern 450 may be substantially coplanar with each other. Here, the top surface of the second mold layer 320, the top surface of the heat-dissipation pattern 410, and the top surface of the connection pattern 450 may be substantially flat. In other words, the top surface of the second mold layer 320, the top surface of the heat-dissipation pattern 410, and the top surface of the connection pattern 450 may be located on the same plane. The second mold layer 320 may be formed of or include an insulating material (e.g., an epoxy molding compound (EMC)).

The redistribution layer 500 may be provided on the second mold layer 320. For example, the redistribution layer 500 may be in direct contact with the top surface of the second mold layer 320, the top surface of the heat-dissipation pattern 410, and the top surface of the connection pattern 450.

According to an example embodiment of the present inventive concept, since the heat-dissipation pattern 410, which is formed of a metallic material having a high mechanical strength, is interposed between the top surface of the first semiconductor chip 200 and the bottom surface of the redistribution layer 500, the redistribution layer 500 may be more supported by the first semiconductor chip 200. In addition, the heat-dissipation pattern 410 may prevent an external stress or strain from being exerted to the first semiconductor chip 200 and thereby prevent the first semiconductor chip 200 from being damaged by an external impact. In other words, a semiconductor package with increased structural stability may be provided.

The redistribution layer 500 may include one or more second substrate interconnection layers which are stacked on top of each other. Each of the second substrate interconnection layers may include a second substrate insulating layer 510 and a second substrate interconnection pattern 520 in the second substrate insulating layer 510. In the case where a plurality of second substrate interconnection layers are provided, the second substrate interconnection pattern 520 of one of the second substrate interconnection layers may be electrically connected to the second substrate interconnection pattern 520 of an adjacent second substrate interconnection layer of the second substrate interconnection layers.

The second substrate insulating layer 510 may include an insulating polymer or a photo-imageable dielectric (PID). For example, the photo-imageable dielectric may include at least one of photo-imageable polyimide (PI), polybenzoxazole (PBO), phenol-based polymers, and/or benzocyclobutene-based polymers. In addition, the second substrate insulating layer 510 may include an insulating material. For example, the second substrate insulating layer 510 may be formed of or include at least one of silicon oxide (SiO), silicon nitride (SiN), silicon oxynitride (SiON), or insulating polymers.

The second substrate interconnection pattern 520 may be provided on the second substrate insulating layer 510. The second substrate interconnection pattern 520 may be horizontally extended on the second substrate insulating layer 510. The second substrate interconnection pattern 520 may be an element that is provided for redistribution on the second substrate interconnection layer. The second substrate interconnection pattern 520 may include a conductive material. For example, the second substrate interconnection pattern 520 may be formed of or include copper (Cu). The second substrate interconnection pattern 520 may have a damascene structure. For example, the second substrate interconnection pattern 520 may have a head portion and a tail portion which are connected to form a single object. The head and tail portions of the second substrate interconnection pattern 520 may have a T-shape.

The head portion of the second substrate interconnection pattern 520 may be, for example, a wire or pad portion which is used to horizontally expand an interconnection line in the redistribution layer 500. The head portion may be provided on a top surface of the second substrate insulating layer 510. For example, the head portion may protrude above the top surface of the second substrate insulating layer 510.

The tail portion of the second substrate interconnection pattern 520 may be a via portion penetrating the second substrate insulating layer 510 and vertically connecting interconnection lines in the redistribution layer 500 to each other. The tail portion may be coupled to another second substrate interconnection layer thereunder. For example, the tail portion of the second substrate insulating layer 510 may be extended from the bottom surface of the head portion to penetrate the second substrate insulating layer 510 and may be coupled to the head portion of the second substrate interconnection pattern 520 of another second substrate interconnection layer thereunder. The tail portion of the second substrate interconnection pattern 520 of the lowermost second substrate interconnection layer of the second substrate interconnection layers may be provided to penetrate the second substrate insulating layer 510 and may be coupled to the connection pattern 450.

According to an example embodiment of the present inventive concept, the connection pattern 450 may have a large width, and this may make it possible to increase a contact area between the penetration electrode 315 and the connection pattern 450 and a contact area between the second substrate interconnection pattern 520 and the connection pattern 450 and to reduce or minimize a resistance between the penetration electrode 315 and the connection pattern 450 and a resistance between the second substrate interconnection pattern 520 and the connection pattern 450. As a result, it may be possible to realize a semiconductor package with improved electric characteristics.

For example, the number of the first substrate interconnection layers in the package substrate 100 may be greater than the number of the second substrate interconnection layers in the redistribution layer 500. For example, an amount of the interconnection lines (e.g., interconnection patterns), which are formed of a metallic material, may be greater in the package substrate 100 than in the redistribution layer 500.

According to an example embodiment of the present inventive concept, the metal pattern 400 may be provided on the top surface of the first semiconductor chip 200 facing the redistribution layer 500. Thus, an amount of a metallic material, which is placed below the first semiconductor chip 200, may be similar to an amount of a metallic material, which is placed above the first semiconductor chip 200. Accordingly, a thermal expansion rate of an upper portion of the semiconductor package, which is placed above the first semiconductor chip 200, may be substantially equal or similar to a thermal expansion rate of a lower portion of the semiconductor package. Thus, it may be possible to reduce a warpage issue of a semiconductor package, which may be caused by heat generated during a process of fabricating or operating a semiconductor package. A thickness of the metal pattern 400 may vary depending on amounts of interconnection lines, which are provided in the package substrate 100 and the redistribution layer 500. For example, a thickness of the heat-dissipation pattern 410 and a thickness of the connection pattern 450 may range from about 1 µm to about 10 µm.

Figure 8:
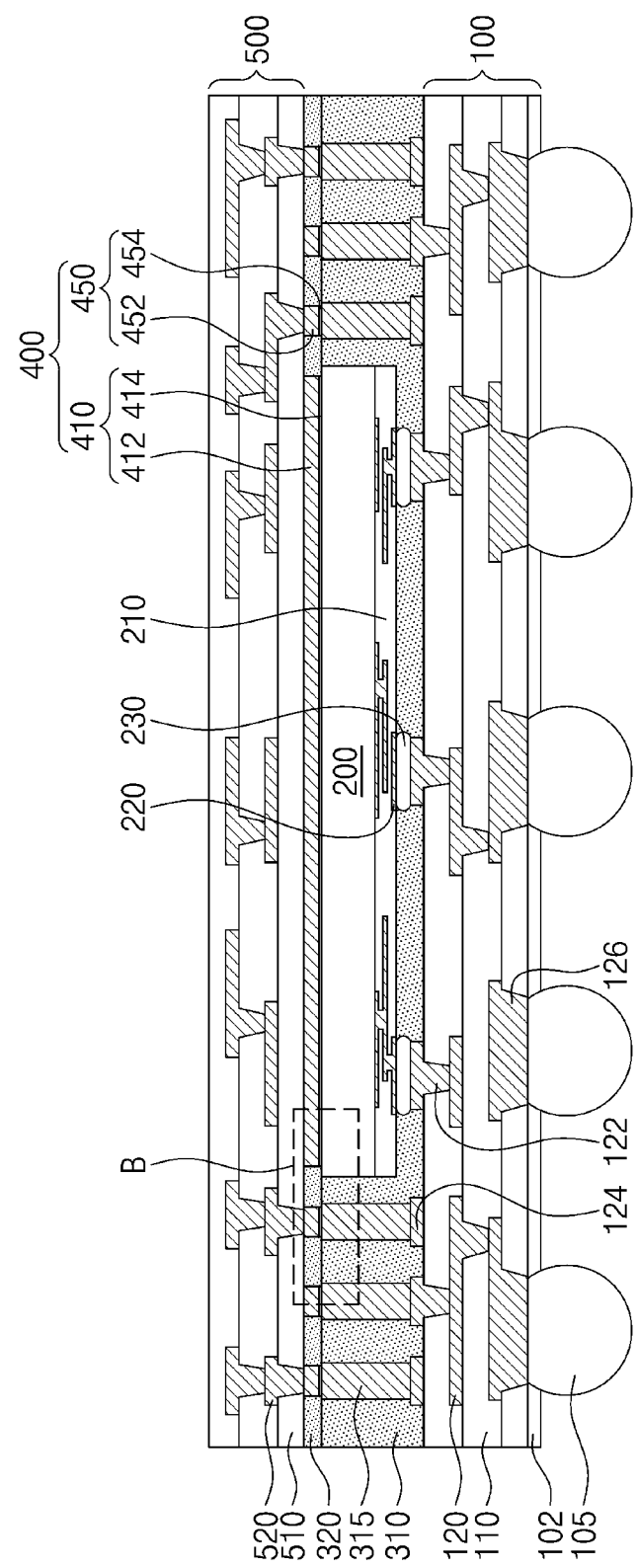
FIG. 8 is a sectional view illustrating a semiconductor package according to an example embodiment of the present inventive concept.
Figure 9:
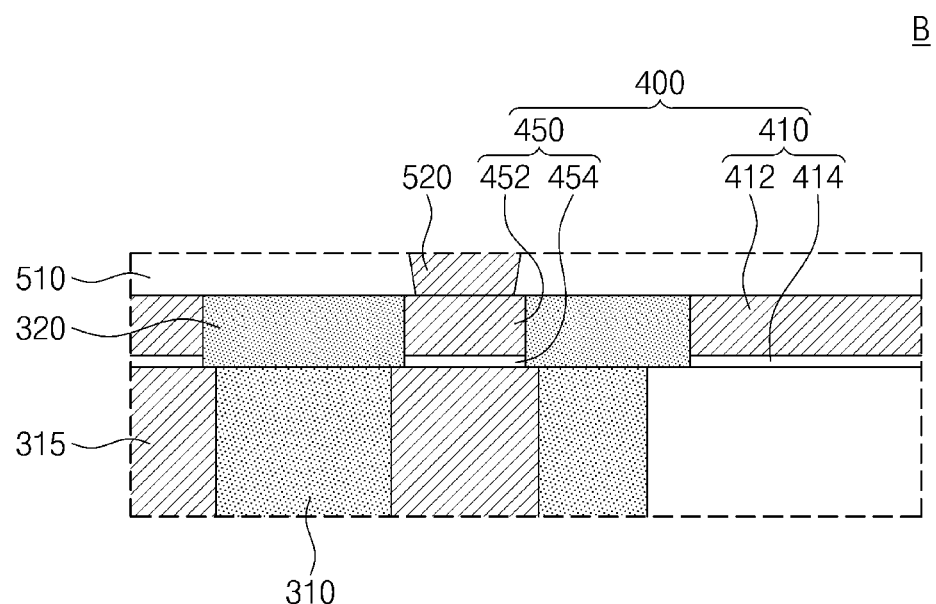
FIG. 9 is an enlarged sectional view illustrating a portion 'B' of FIG. 8.

FIG. 8 is a sectional view illustrating a semiconductor package according to an example embodiment of the present inventive concept. FIG. 9 is an enlarged sectional view illustrating a portion 'B' of FIG. 8. For concise description, an element previously described with reference to FIGS. 1 to 7 may be identified by the same reference number without repeating an overlapping description thereof. That is, technical features, which are different from those in the embodiments of FIGS. 1 to 7, will be mainly described below.

Referring to FIGS. 8 and 9, the package substrate 100 may be provided. The package substrate 100 may include one or more first substrate interconnection layers which are stacked on top of each other. Each of the first substrate interconnection layers may include a first substrate insulating layer 110 and a first substrate interconnection pattern 120 in the first substrate insulating layer 110.

The first semiconductor chip 200 may be mounted on the package substrate 100. For example, the first semiconductor chip 200 may be mounted on the package substrate 100 in a flip-chip manner. The first semiconductor chip 200 may be mounted on the package substrate 100 through the first chip terminals 230. The first chip terminals 230 may connect the first chip pads 220 of the first semiconductor chip 200 to the first substrate pads 122 of the package substrate 100.

The first mold layer 310 may be provided on the package substrate 100. The first mold layer 310 may cover the top surface of the package substrate 100. The first mold layer 310 may at least partially enclose the first semiconductor chip 200, when viewed in a plan view. The first mold layer 310 may cover the side surface of the first semiconductor chip 200 and may expose the top surface of the first semiconductor chip 200.

The penetration electrode 315 may be provided on the package substrate 100. The penetration electrode 315 may be horizontally spaced apart from the first semiconductor chip 200. The penetration electrode 315 may vertically penetrate the first mold layer 310. An end portion of the penetration electrode 315 may be extended toward the package substrate 100 and may be coupled to the second substrate pad 124 of the package substrate 100. Another end portion of the penetration electrode 315 may be exposed by the first mold layer 310 near the top surface of the first mold layer 310.

The metal pattern 400 may be provided on the first semiconductor chip 200 and the first mold layer 310. The metal pattern 400 may include the heat-dissipation pattern 410, which is provided on the top surface of the first semiconductor chip 200, and the connection pattern 450, which is provided on the first mold layer 310.

The heat-dissipation pattern 410 may be provided on the top surface of the first semiconductor chip 200. For example, the heat-dissipation pattern 410 may be in direct contact with the top surface of the first semiconductor chip 200. A planar area of the heat-dissipation pattern 410 may be smaller than a planar area of the first semiconductor chip 200. The entirety of the heat-dissipation pattern 410 may be vertically overlapped with the first semiconductor chip 200.

The connection pattern 450 may be provided on the top surface of the penetration electrode 315. For example, the connection pattern 450 may be in direct contact with the top surface of the penetration electrode 315. The connection pattern 450 may have the second metal pattern 452, which is formed of the same material as the first metal pattern 412. The connection pattern 450 may further include the second seed/barrier layer 454, which is interposed between the bottom surface of the second metal pattern 452 and the top surface of the penetration electrode 315. The second seed/barrier layer 454 may cover the bottom surface of the second metal pattern 452.

A planar area of the connection pattern 450 may be smaller than a planar area of the penetration electrode 315. A width of the connection pattern 450 may be smaller than a width of the penetration electrode 315. For example, the entirety of the connection pattern 450 may be vertically overlapped with the penetration electrode 315. The connection pattern 450 may be electrically connected with the penetration electrode 315. For example, the entire bottom surface of the connection pattern 450 may be in contact with the penetration electrode 315. In addition, the width of the connection pattern 450 may be substantially equal to the width of the penetration electrode 315. For example, the entire bottom surface of the connection pattern 450 may be in contact with the entire top surface of the penetration electrode 315. The top surface of the connection pattern 450 may be provided at the same level as the top surface of the heat-dissipation pattern 410. In an example embodiment present inventive concept, the semiconductor package may include a plurality of the penetration electrodes 315 and a plurality of the connection patterns 450, and in this case, each of the connection patterns 450 may be connected to a corresponding one of the penetration electrodes 315.

The second mold layer 320 may be provided on the first mold layer 310. The second mold layer 320 may cover the top surface of the first mold layer 310. The second mold layer 320 may cover the side surface of the heat-dissipation pattern 410 and the side surfaces of the connection patterns 450 and may expose the top surface of the heat-dissipation pattern 410 and the top surfaces of the connection patterns 450. For example, the top surface of the second mold layer 320, the top surface of the heat-dissipation pattern 410, and the top surfaces of the connection patterns 450 may be substantially coplanar with each other.

The redistribution layer 500 may be provided on the second mold layer 320. For example, the redistribution layer 500 may be in contact with the top surface of the second mold layer 320, the top surface of the heat-dissipation pattern 410, and the top surfaces of the connection patterns 450. The redistribution layer 500 may include one or more second substrate interconnection layers which are stacked on top of each other. Each of the second substrate interconnection layers may include the second substrate insulating layer 510 and the second substrate interconnection pattern 520 in the second substrate insulating layer 510. The second substrate interconnection pattern 520 of the lowermost second substrate interconnection layers of the second substrate interconnection layers may penetrate the second substrate insulating layer 510 and may be coupled to the connection patterns 450.

According to an example embodiment of the present inventive concept, since the connection patterns 450 have a small width, it may be possible to increase a density of the connection patterns 450 and thereby increase a density of wires, which are provided in the redistribution layer 500 and are connected to the connection patterns 450. That is, a semiconductor package may be provided to have an increased integration density and/or a reduced size.

Figure 10:
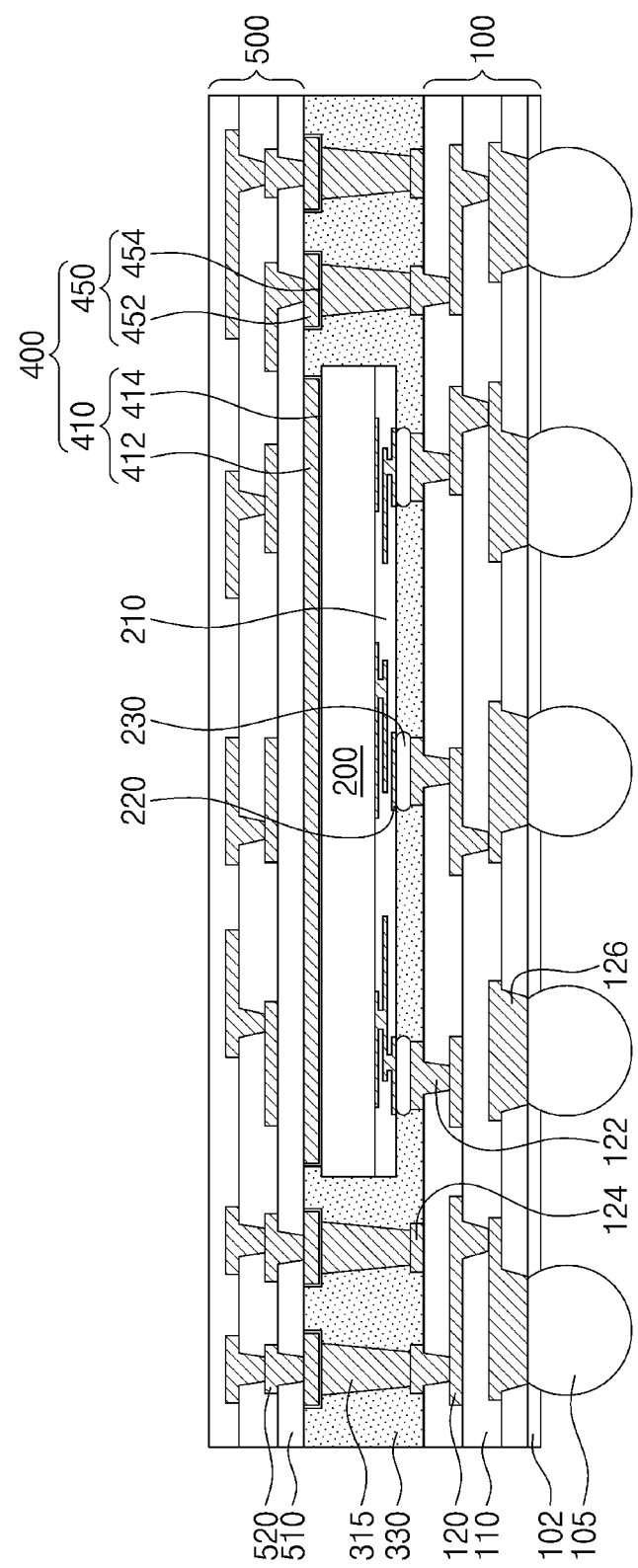
FIGS. 10 and 11 are sectional views illustrating a semiconductor package according to an example embodiment of the present inventive concept.

FIG. 10 is a sectional view illustrating a semiconductor package according to an example embodiment of the present inventive concept. FIGS. 1 to 9 illustrate examples in which the penetration electrode 315 and the first semiconductor chip 200 are disposed in the first mold layer 310. In addition, FIGS. 1 to 9 illustrate examples in which the metal pattern 400 is disposed in the second mold layer 320. However, the present inventive concept is not limited to these examples.

Referring to FIG. 10, the package substrate 100 may be provided. The package substrate 100 may include one or more first substrate interconnection layers which are stacked on top of each other. Each of the first substrate interconnection layers may include the first substrate insulating layer 110 and the first substrate interconnection pattern 120 in the first substrate insulating layer 110.

The first semiconductor chip 200 may be mounted on the package substrate 100. For example, the first semiconductor chip 200 may be mounted on the package substrate 100 in a flip-chip manner. The first chip terminals 230 may connect the first chip pads 220 of the first semiconductor chip 200 to the first substrate pads 122 of the package substrate 100.

The penetration electrode 315 may be provided on the package substrate 100. The penetration electrode 315 may be horizontally spaced apart from the first semiconductor chip 200. The penetration electrode 315 may be coupled to the second substrate pad 124 of the package substrate 100. For example, the top surface of the penetration electrode 315 may be located at the same level as the top surface of the first semiconductor chip 200. In other words, the top surface of the penetration electrode 315 and the top surface of the first semiconductor chip 200 may be located on the same plane.

The heat-dissipation pattern 410 may be disposed on the first semiconductor chip 200. The heat-dissipation pattern 410 may be provided on the top surface of the first semiconductor chip 200. For example, the heat-dissipation pattern 410 may be in direct contact with the top surface of the first semiconductor chip 200. The heat-dissipation pattern 410 may include the first metal pattern 412, which is formed of a metallic material having a high thermal conductivity. The heat-dissipation pattern 410 may further include the first seed/barrier layer 414, which is interposed between the bottom surface of the first metal pattern 412 and the top surface of the first semiconductor chip 200. The first seed/barrier layer 414 may at least partially cover the bottom surface of the first metal pattern 412 and may be extended to at least partially cover the side surface of the first metal pattern 412. In other words, the bottom and side surfaces of the first metal pattern 412 may be at least partially covered with the first seed/barrier layer 414. A planar area of the heat-dissipation pattern 410 may be smaller than a planar area of the first semiconductor chip 200. A width of the heat-dissipation pattern 410 may be smaller than a width of the first semiconductor chip 200. The entirety of the heat-dissipation pattern 410 may be vertically overlapped with the first semiconductor chip 200.

The connection pattern 450 may be disposed on the penetration electrode 315. The connection pattern 450 may be provided on the top surface of the penetration electrode 315. For example, the connection pattern 450 may be in direct contact with the top surface of the penetration electrode 315. The connection pattern 450 may have the second metal pattern 452, which is formed of the same material as the first metal pattern 412. The connection pattern 450 may further include the second seed/barrier layer 454, which is interposed between the bottom surface of the second metal pattern 452 and the top surface of the penetration electrode 315. The second seed/barrier layer 454 may at least partially cover the bottom surface of the second metal pattern 452 and may be extended to at least partially cover the side surface of the second metal pattern 452. In other words, the bottom and side surfaces of the second metal pattern 452 may be at least partially covered with the second seed/barrier layer 454.

A third mold layer 330 may be provided on the package substrate 100. The third mold layer 330 may cover the top surface of the package substrate 100. The third mold layer 330 may be provided to at least partially enclose the first semiconductor chip 200, the penetration electrode 315, and the metal pattern 400, when viewed in a plan view. For example, the third mold layer 330 may include a lower portion, which covers the side surface of the first semiconductor chip 200 and the side surface of the penetration electrode 315, and an upper portion, which covers the side surface of the heat-dissipation pattern 410 and the side surface of the connection pattern 450. The third mold layer 330 may expose the top surface of the heat-dissipation pattern 410 and the top surface of the connection pattern 450. In other words, the first semiconductor chip 200 and the penetration electrode 315 may be fully buried in the third mold layer 330, and the metal pattern 400 may be provided in the third mold layer 330 but may be exposed by the third mold layer 330 near a top surface of the third mold layer 330. For example, the top surface of the first semiconductor chip 200 may be completely covered by the third mold layer 330 and the heat dissipation pattern 410, and the top surface of the penetration electrode 315 may be completely covered by the connection pattern 450. For example, the top surface of the third mold layer 330, the top surface of the heat-dissipation pattern 410, and the top surface of the connection pattern 450 may be substantially coplanar with each other. Here, the top surface of the third mold layer 330, the top surface of the heat-dissipation pattern 410, and the top surface of the connection pattern 450 may be substantially flat. In other words, the top surface of the third mold layer 330, the top surface of the heat-dissipation pattern 410, and the top surface of the connection pattern 450 may be located on substantially the same plane. The third mold layer 330 may be formed of or include an insulating material (e.g., an epoxy molding compound (EMC)).

The redistribution layer 500 may be provided on the third mold layer 330. For example, the redistribution layer 500 may be in contact with the top surface of the third mold layer 330, the top surface of the heat-dissipation pattern 410, and the top surfaces of the connection patterns 450. The redistribution layer 500 may include one or more second substrate interconnection layers which are stacked on top of each other. Each of the second substrate interconnection layers may include the second substrate insulating layer 510 and the second substrate interconnection pattern 520 in the second substrate insulating layer 510. The second substrate interconnection pattern 520 of the lowermost second substrate interconnection layer of the second substrate interconnection layers may penetrate the second substrate insulating layer 510 and may be coupled to the connection patterns 450.

Figure 11:
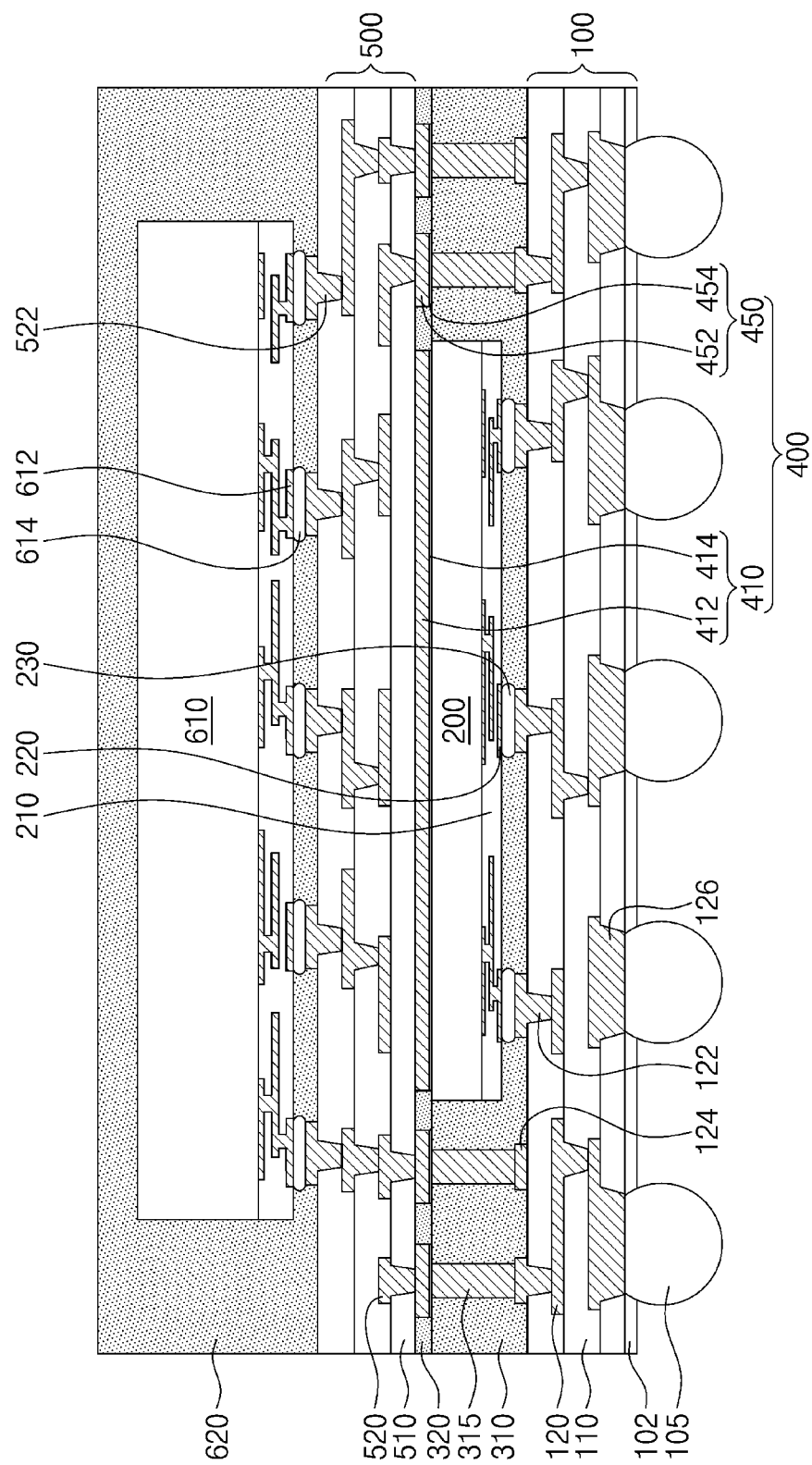

FIG. 11 is a sectional view illustrating a semiconductor package according to an example embodiment of the present inventive concept.

Referring to FIG. 11, the first semiconductor chip 200 may be mounted on the package substrate 100. The first mold layer 310 may be provided on the package substrate 100. The first mold layer 310 may cover the top surface of the package substrate 100. The first mold layer 310 may cover the side surface of the first semiconductor chip 200 and may expose the top surface of the first semiconductor chip 200. The penetration electrode 315 may be provided on the package substrate 100. The penetration electrode 315 may vertically penetrate the first mold layer 310 and may be coupled to the second substrate pad 124 of the package substrate 100. Another end portion of the penetration electrode 315 may be exposed by the first mold layer 310 near the top surface of the first mold layer 310. The metal pattern 400 may be provided on the first semiconductor chip 200 and the first mold layer 310. The metal pattern 400 may include the heat-dissipation pattern 410 and the connection pattern 450. The hear-dissipation pattern 410 may be provided on the top surface of the first semiconductor chip 200. The connection pattern 450 may be provided on the top surface of the penetration electrode 315. The second mold layer 320 may be provided on the first mold layer 310.

The redistribution layer 500 may be disposed on the top surface of the second mold layer 320, the top surface of the heat-dissipation pattern 410, and the top surfaces of the connection patterns 450. The redistribution layer 500 may contact the top surface of the second mold layer 320, the top surface of the heat-dissipation pattern 410, and the top surfaces of the connection patterns 450. The redistribution layer 500 may include one or more second substrate interconnection layers which are stacked on top of each other. Each of the second substrate interconnection layers may include the second substrate insulating layer 510 and the second substrate interconnection pattern 520 in the second substrate insulating layer 510. The second substrate interconnection pattern 520 of the lowermost second substrate interconnection layer of the second substrate interconnection layers may penetrate the second substrate insulating layer 510 and may be coupled to the connection patterns 450. The second substrate interconnection pattern 520 of the uppermost second substrate interconnection layer of the second substrate interconnection layers may be exposed by the second substrate insulating layer 510 near the top surface of the second substrate insulating layer 510 and may correspond to redistribution layer pads 522, on which a second semiconductor chip 610 is mounted.

The second semiconductor chip 610 may be disposed on the redistribution layer 500. The second semiconductor chip 610 may include a memory chip or a logic chip. In addition, the second semiconductor chip 610 may include a passive element. The second semiconductor chip 610 may include second chip pads 612 provided on a bottom surface thereof. The second chip pads 612 may be electrically connected to integrated circuits in the second semiconductor chip 610. Second chip terminals 614 may be provided on the bottom surface of the second semiconductor chip 610. The second chip terminals 614 may be provided on bottom surfaces of the second chip pads 612 and may be coupled to the second chip pads 612.

The second semiconductor chip 610 may be mounted on the redistribution layer 500. For example, the second semiconductor chip 610 may be coupled to the redistribution layer pads 522 of the redistribution layer 500 through the second chip terminals 614. The second chip terminals 614 may be provided between the redistribution layer pads 522 of the redistribution layer 500 and the second chip pads 612. For example, in the case where the second semiconductor chip 610 is provided in a face-down manner, the second chip terminals 614 may include solder balls, solder bumps, or the like. In the case where the second semiconductor chip 610 is provided in a face-up manner, the second chip terminals 614 may include connection wires or the like.

A fourth mold layer 620 may be provided on the redistribution layer 500. The fourth mold layer 620 may cover a top surface of the redistribution layer 500. The fourth mold layer 620 may be provided to at least partially enclose the second semiconductor chip 610. The fourth mold layer 620 may include an insulating material. For example, the fourth mold layer 620 may be formed of or include an epoxy molding compound (EMC).

FIGS. 12 to 22 are sectional views illustrating a method of fabricating a semiconductor package, according to an example embodiment of the present inventive concept.

Figure 12:
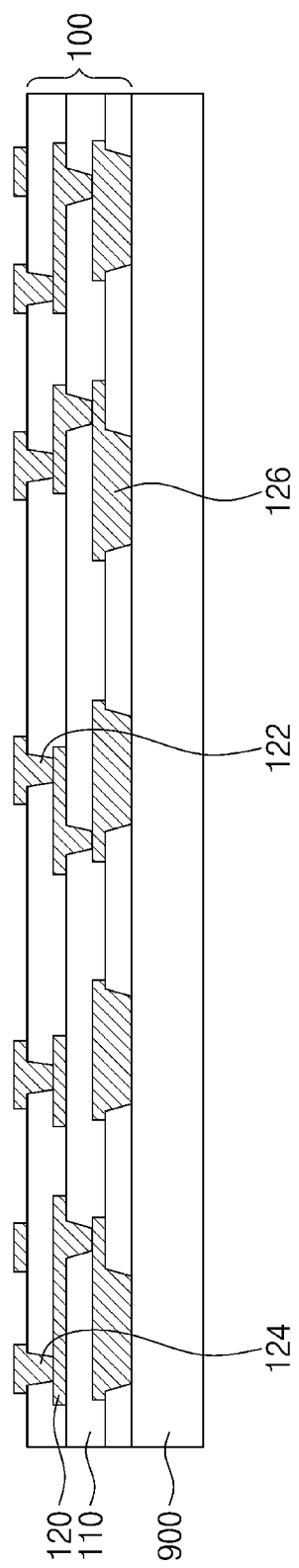
FIGS. 12, 13, 14, 15, 16, 17, 18, 19, 20, 21 and 22 are sectional views illustrating a method of fabricating a semiconductor package, according to an example embodiment of the present inventive concept.

Referring to FIG. 12, a carrier substrate 900 may be provided. The carrier substrate 900 may be an insulating substrate, which is formed of or includes, for example, glass or a polymer, or a conductive substrate, which is formed of or includes a metallic material. An adhesive member may be provided on a top surface of the carrier substrate 900. As an example, the adhesive element may include an adhesive tape.

The first substrate insulating layer 110 may be formed on the carrier substrate 900. For example, the first substrate insulating layer 110 may be formed by coating and curing an insulating material on the carrier substrate 900. The first substrate insulating layer 110 may be formed to cover the top surface of the carrier substrate 900. For example, the insulating material may include a photo-imageable dielectric (PID).

The first substrate insulating layer 110 may be patterned to form openings. The openings may be formed to expose the top surface of the carrier substrate 900. The openings may provide regions, in which the under-bump pads 126 will be formed.

The first substrate interconnection pattern 120 may be formed on the first substrate insulating layer 110. For example, the formation of the first substrate interconnection pattern 120 may include forming a seed/barrier layer on the top surface of the first substrate insulating layer 110, forming a mask pattern on the seed/barrier layer, and performing a plating process using the seed/barrier layer, which is exposed by the mask pattern, as a seed layer. Thereafter, the mask pattern and a portion of the seed/barrier layer, which is disposed below the mask pattern, may be removed.

As a result of the afore-described process, a first substrate interconnection layer including the first substrate insulating layer 110 and the first substrate interconnection pattern 120 may be formed. The process of forming the first substrate interconnection layer may be repeated to form a plurality of the first substrate interconnection layers and thus form the package substrate 100. The first substrate interconnection pattern 120 of the uppermost first substrate interconnection layer of the first substrate interconnection layers may correspond to the first substrate pads 122 and the second substrate pads 124 of the package substrate 100.

Figure 13:
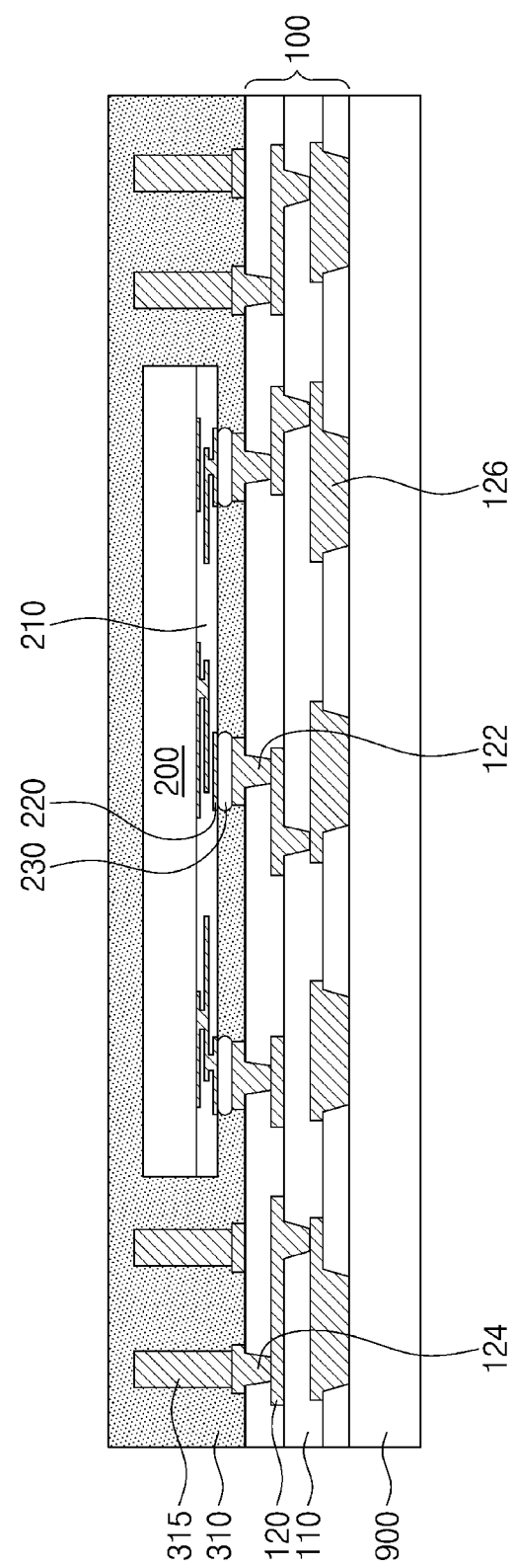

Referring to FIG. 13, the penetration electrode 315 may be formed on the package substrate 100. For example, a sacrificial layer may be formed on the package substrate 100. The sacrificial layer may cover the top surface of the package substrate 100. In an example embodiment of the present inventive concept, the sacrificial layer may be formed of or include a photoresist material. An etching process may be performed on the sacrificial layer to form a via hole penetrating the sacrificial layer and exposing the second substrate pad 124. Next, the penetration electrode 315 may be formed by filling the via hole with a conductive material. The sacrificial layer may be removed in a subsequent step. In an example embodiment of the present inventive concept, a plurality of the penetration electrodes 315 may be formed if desired.

The first semiconductor chip 200 may be provided. The first semiconductor chip 200 may be configured to have substantially the same or similar features as those described with reference to FIG. 1. For example, the first semiconductor chip 200 may include the first circuit layer 210, which is provided on an active surface of the first semiconductor chip 200, and the first chip pads 220, which is connected to the first circuit layer 210. For example, the first chip pads 220 are disposed at the bottom surface of the first circuit layer 210.

The first semiconductor chip 200 may be mounted on the package substrate 100. For example, the first chip terminals 230 may be provided on the first chip pads 220 of the first semiconductor chip 200. The first semiconductor chip 200 may be aligned such that the first chip terminals 230 are placed on the first substrate pads 122 of the package substrate 100, and a reflow process may be performed to connect the first chip terminals 230 to the first substrate pads 122.

The first mold layer 310 may be formed on the package substrate 100. For example, a molding material may be coated on the top surface of the package substrate 100 to bury or cover the first semiconductor chip 200. The first mold layer 310 may be formed by curing the molding material. The first mold layer 310 may be formed to cover side and top surfaces of the first semiconductor chip 200. The first mold layer 310 may be formed to enclose the penetration electrode 315. Here, the penetration electrode 315 may be buried in the first mold layer 310.

Figure 14:
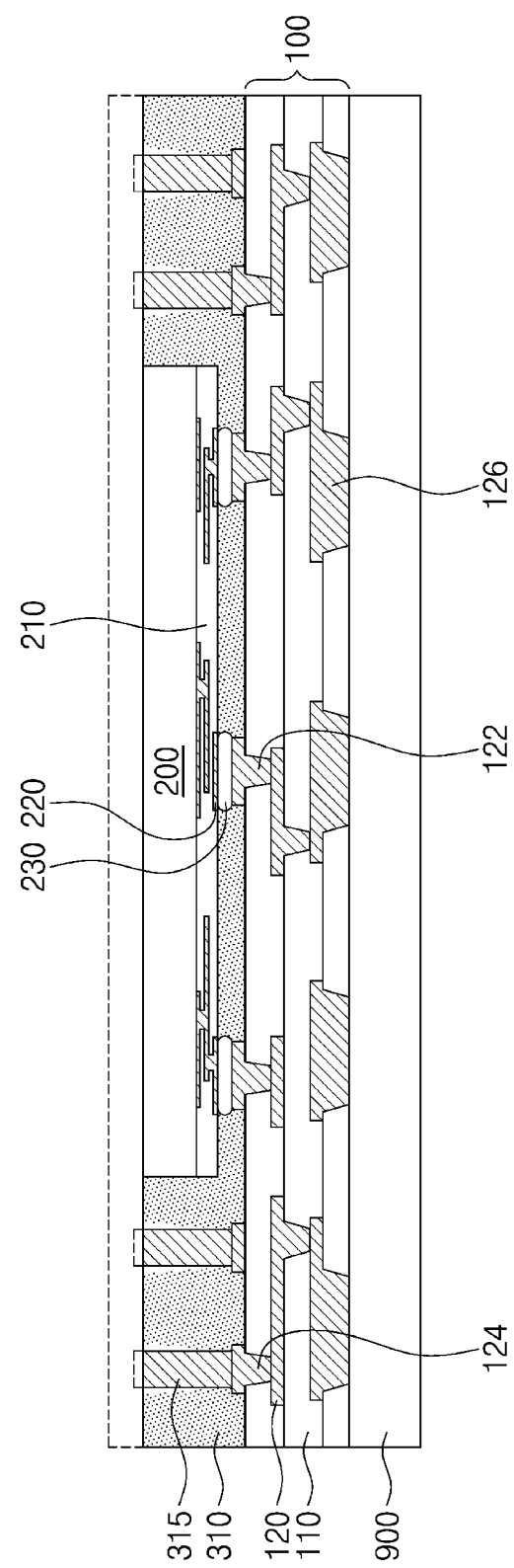

Referring to FIG. 14, the first mold layer 310 may be partially removed. For example, a thinning process may be performed on the first mold layer 310. For example, a grinding process or a chemical mechanical polishing (CMP) process may be performed on the top surface of the first mold layer 310. Thus, the first mold layer 310 may have a planarized or flat top surface. The thinning process may be performed until a top surface of the first semiconductor chip 200 and a top surface of the penetration electrode 315 are exposed to the outside. During the thinning process, an upper portion of the first mold layer 310 may be partially removed, and in an example embodiment of the present inventive concept, an upper portion of the penetration electrode 315 or an upper portion of the first semiconductor chip 200 may also be partially removed during the thinning process. For example, in the case where the top surface of the penetration electrode 315 is located at a level higher than the top surface of the first semiconductor chip 200, the thinning process may be performed to partially remove the upper portion of the penetration electrode 315. In the case where the top surface of the first semiconductor chip 200 is located at a level higher than the top surface of the penetration electrode 315, the thinning process may be performed to partially remove the upper portion of the first semiconductor chip 200.

After the thinning process, the top surface of the first semiconductor chip 200 and the top surface of the penetration electrode 315 may be exposed to the outside. The top surface of the first semiconductor chip 200, the top surface of the penetration electrode 315, and the top surface of the first mold layer 310 may be substantially flat and may be substantially coplanar with each other.

Figure 15:
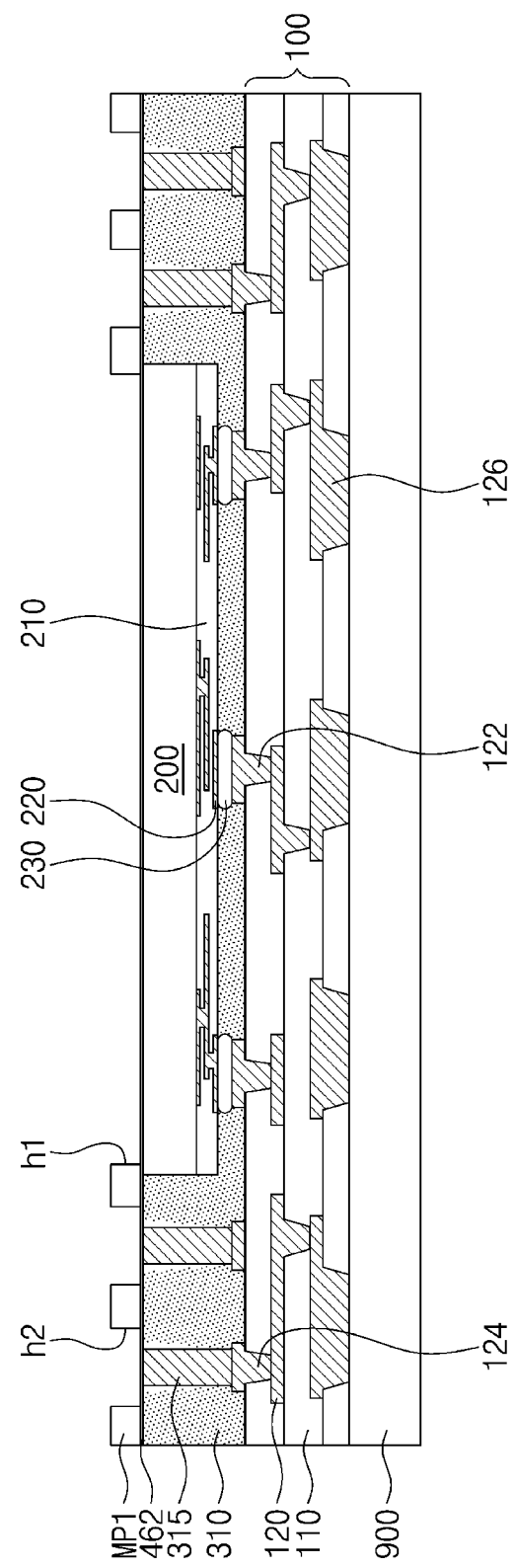

Referring to FIG. 15, a third seed/barrier layer 462 may be formed on the first mold layer 310. For example, the third seed/barrier layer 462 may be formed on the top surface of the first mold layer 310 and may cover the top surface of the first semiconductor chip 200 and the top surface of the penetration electrode 315.

A first mask pattern MP1 may be formed on the third seed/barrier layer 462. For example, the first mask pattern MP1 may be formed by forming a photoresist (PR) layer on the third seed/barrier layer 462 and performing a process of exposing and developing the photoresist layer. The first mask pattern MP1 may have a first hole h1, which overlaps the first semiconductor chip 200, and a second hole h2, which overlaps the penetration electrode 315. Each of the first and second holes h1 and h2 may be formed to expose a portion of a top surface of the third seed/barrier layer 462. In an example embodiment of the present inventive concept, at least one or each of the first and second holes h1 and h2 of the first mask pattern MP1 may be formed to have an inner side surface that is perpendicular to the top surface of the first mold layer 310.

A planar area of the first hole h1 may be smaller than a planar area of the first semiconductor chip 200. A width of the first hole h1 may be smaller than a width of the first semiconductor chip 200. The entirety of the first hole h1 may vertically overlap the first semiconductor chip 200.

A planar area of the second hole h2 may be larger than a planar area of the penetration electrode 315. A width of the second hole h2 may be larger than a width of the penetration electrode 315. The second hole h2 may vertically overlap the entirety of the penetration electrode 315. In the case where a plurality of penetration electrodes 315 are formed, the second hole h2 may also be formed in plural, and in this case, each of the second holes h2 may be formed on a corresponding penetration electrode 315 of the penetration electrodes 315.

Figure 16:
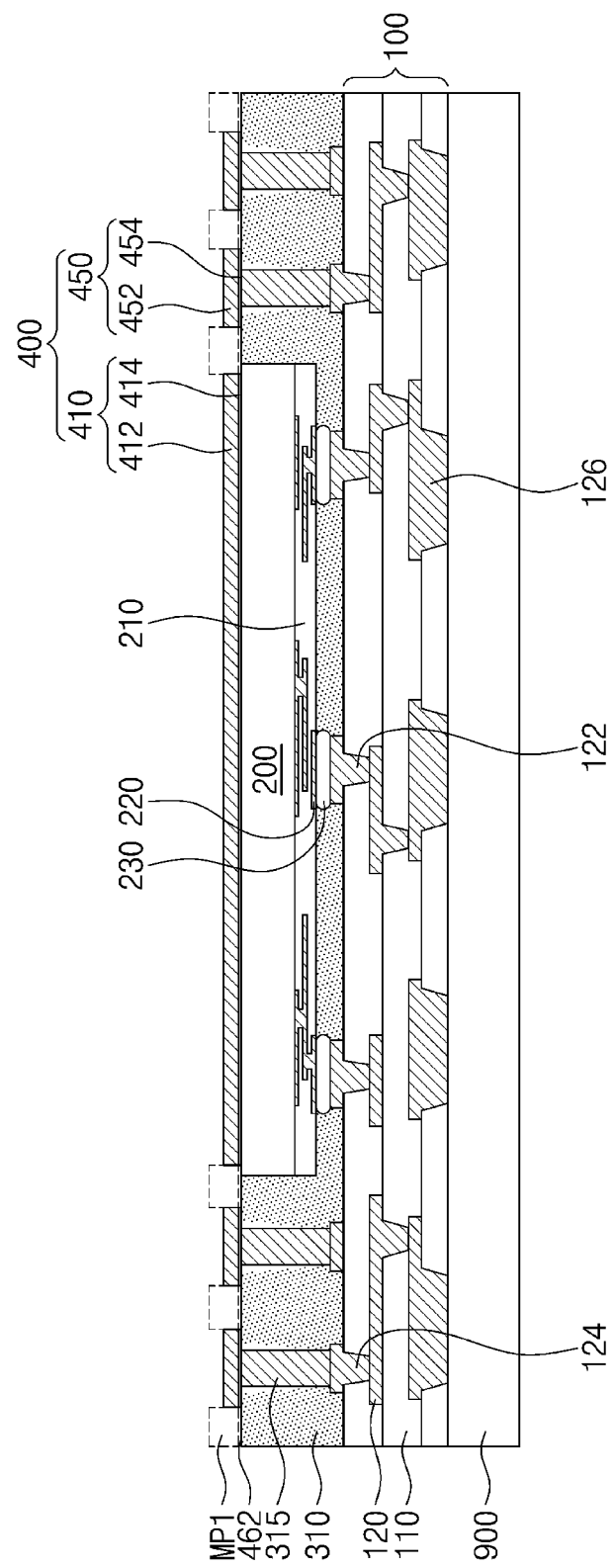

Referring to FIG. 16, the metal pattern 400 may be formed. For example, a plating process, in which the third seed/barrier layer 462 is used as a seed layer, may be performed to fill the first and second holes h1 and h2 of the first mask pattern MP1 with a metallic material or to form the first metal pattern 412 and the second metal pattern 452. The plating process may include an electro-plating process. The inner side surfaces of the first and second holes h1 and h2 of the first mask pattern MP1 may be formed to be substantially perpendicular to the top surface of the first mold layer 310, and thus, the first and second metal patterns 412 and 452, which are respectively in contact with the inner side surfaces of the first and second holes h1 and h2, may be formed to have side surfaces that are substantially perpendicular to the top surface of the first mold layer 310.

The first mask pattern MP1 may be removed to expose a portion of the third seed/barrier layer 462. The exposed portion of the third seed/barrier layer 462 may be a portion of the third seed/barrier layer 462 that was placed below the first mask pattern MP1 prior to the removal of the first mask pattern MP1. In other words, the exposed portion of the third seed/barrier layer 462 may be located between the first metal pattern 412 and the second metal pattern 452.

An etching process may be performed on the exposed portion of the third seed/barrier layer 462. As a result of the etching process, the third seed/barrier layer 462 may be divided into the first seed/barrier layer 414 and the second seed/barrier layer 454. The first seed/barrier layer 414 may be a portion of the third seed/barrier layer 462, which is left below the first metal pattern 412 after the etching process, and the second seed/barrier layer 454 may be a portion of the third seed/barrier layer 462, which is left below the second metal pattern 452 after the etching process. The first metal pattern 412 and the first seed/barrier layer 414 may constitute the heat-dissipation pattern 410 described with reference to FIGS. 1 and 2, and the second metal pattern 452 and the second seed/barrier layer 454 may constitute the connection pattern 450 described with reference to FIGS. 1 and 2.

Figure 17:
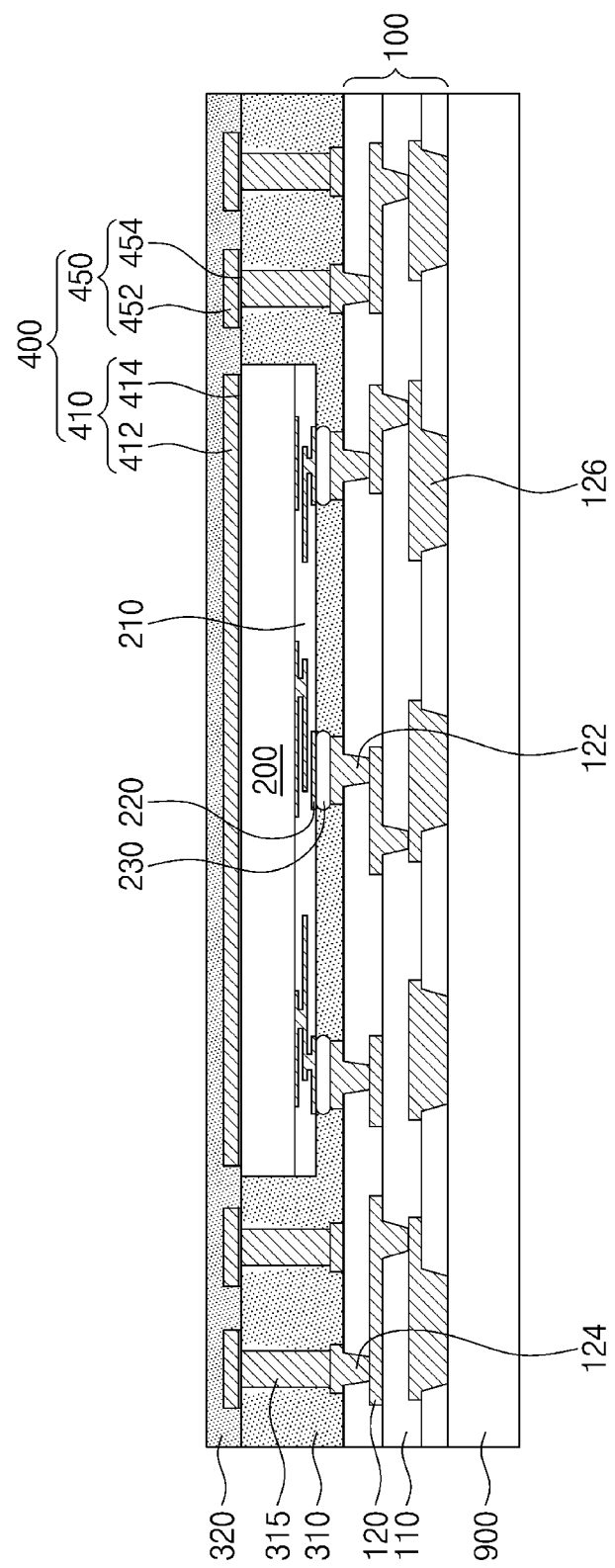

Referring to FIG. 17, the second mold layer 320 may be formed on the first mold layer 310. For example, a molding material may be coated on the top surface of the first mold layer 310 to bury or cover the heat-dissipation pattern 410 and the connection pattern 450. The second mold layer 320 may be formed by curing the molding material. For example, the second mold layer 320 may be formed to cover side and top surfaces of the heat-dissipation pattern 410 and side and top surfaces of the connection pattern 450. In other words, the heat-dissipation pattern 410 and the connection pattern 450 may be covered with the second mold layer 320.

Figure 18:
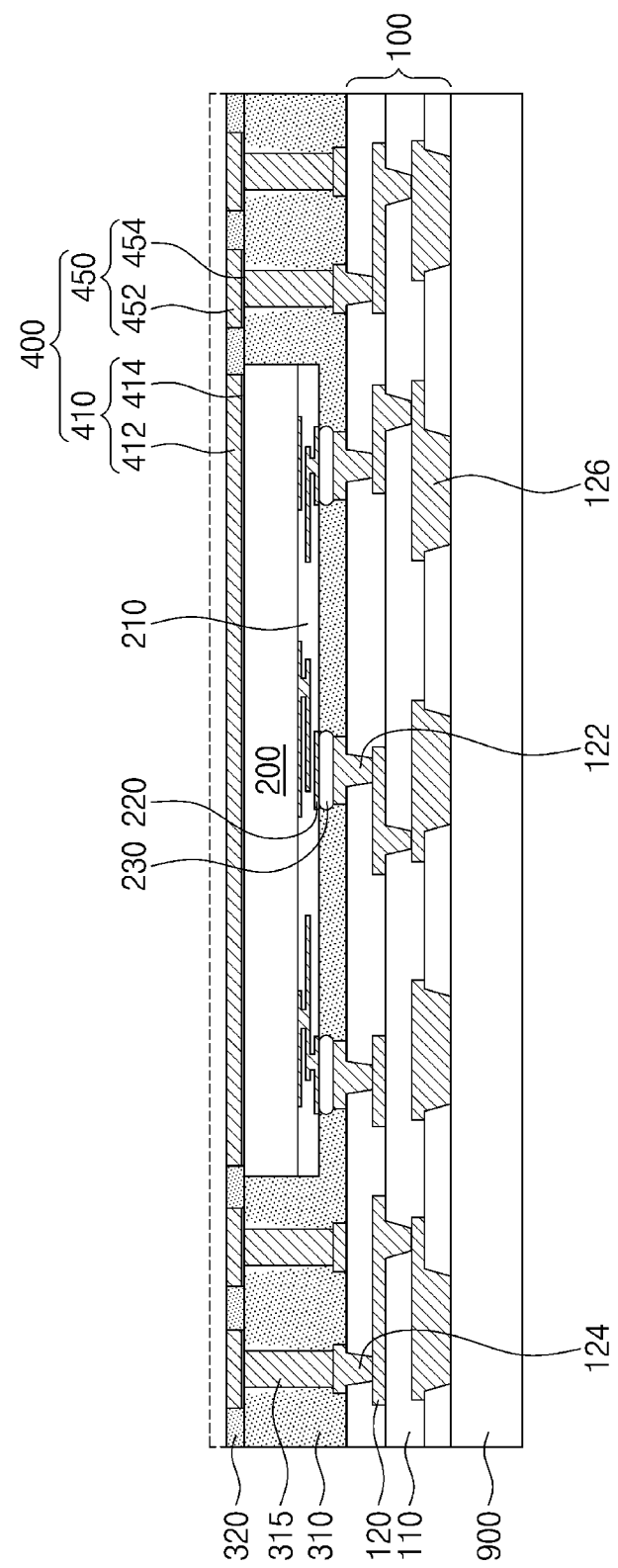

Referring to FIG. 18, the second mold layer 320 may be partially removed. For example, a thinning process may be performed on the second mold layer 320. For example, a grinding process or a chemical mechanical polishing (CMP) process may be performed on the top surface of the second mold layer 320. Thus, the second mold layer 320 may have a planarized or flat top surface. The thinning process may be performed until a top surface of the heat-dissipation pattern 410 and a top surface of the connection pattern 450 is exposed to the outside. During the thinning process, an upper portion of the second mold layer 320 may be partially removed, and in an example embodiment of the present inventive concept, an upper portion of the heat-dissipation pattern 410 and/or an upper portion of the connection pattern 450 may also be partially removed by the thinning process.

After the thinning process, the top surface of the heat-dissipation pattern 410 and the top surface of the connection pattern 450 may be exposed to the outside. The top surface of the heat-dissipation pattern 410, the top surface of the connection pattern 450, and the top surface of the second mold layer 320 may be substantially flat and may be substantially coplanar with each other.

FIGS. 15 to 18 illustrate an example in which the heat-dissipation pattern 410 and the connection pattern 450 are formed on the first mold layer 310 and then the second mold layer 320 is formed thereon, but the present inventive concept is not limited to this example.

Figure 19:
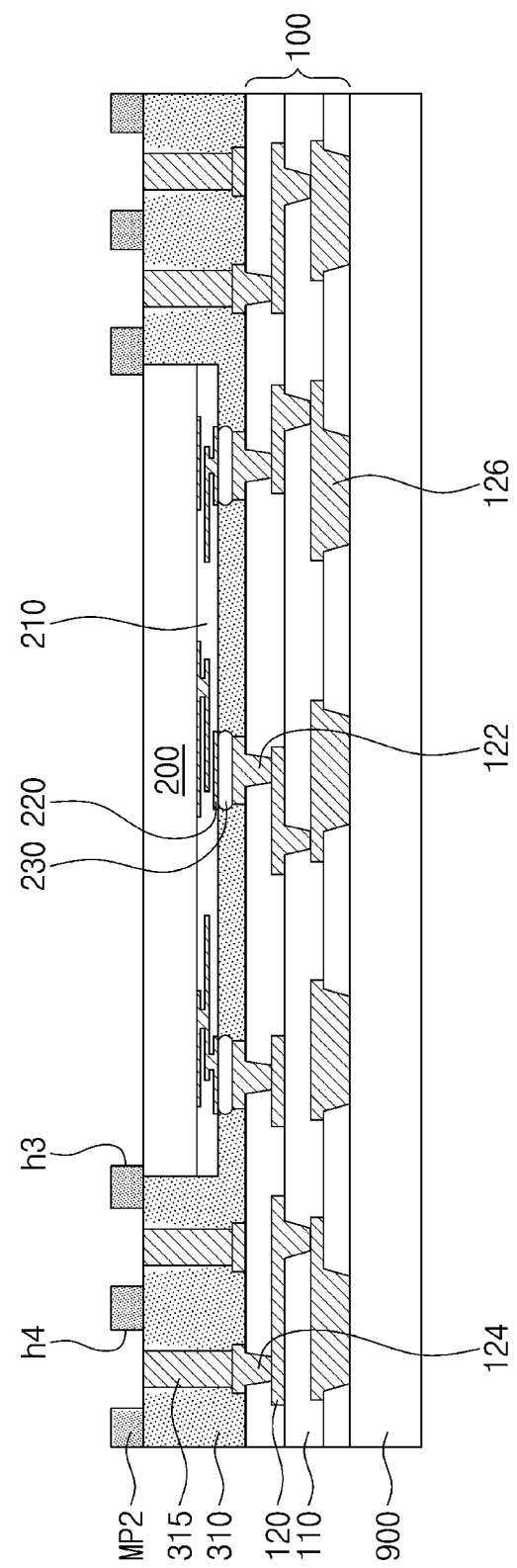

Referring to FIG. 19, a second mask pattern MP2 may be formed on the structure of FIG. 14 (e.g., on the first mold layer 310). For example, an insulating material layer may be formed on the first mold layer 310 and may be patterned to form the second mask pattern MP2. The second mask pattern MP2 may have a third hole h3, which exposes the top surface of the first semiconductor chip 200, and a fourth hole h4, which exposes the top surface of the penetration electrode 315.

A planar area of the third hole h3 may be smaller than a planar area of the first semiconductor chip 200. A width of the third hole h3 may be smaller than a width of the first semiconductor chip 200. The entirety of the third hole h3 may vertically overlap the first semiconductor chip 200. Thus, the third hole h3 may expose a portion of the top surface of the first semiconductor chip 200.

A planar area of the fourth hole h4 may be larger than a planar area of the penetration electrode 315. In other words, the fourth hole h4 may be formed to expose the entire top surface of the penetration electrode 315. A width of the fourth hole h4 may be larger than a width of the penetration electrode 315.

Figure 20:
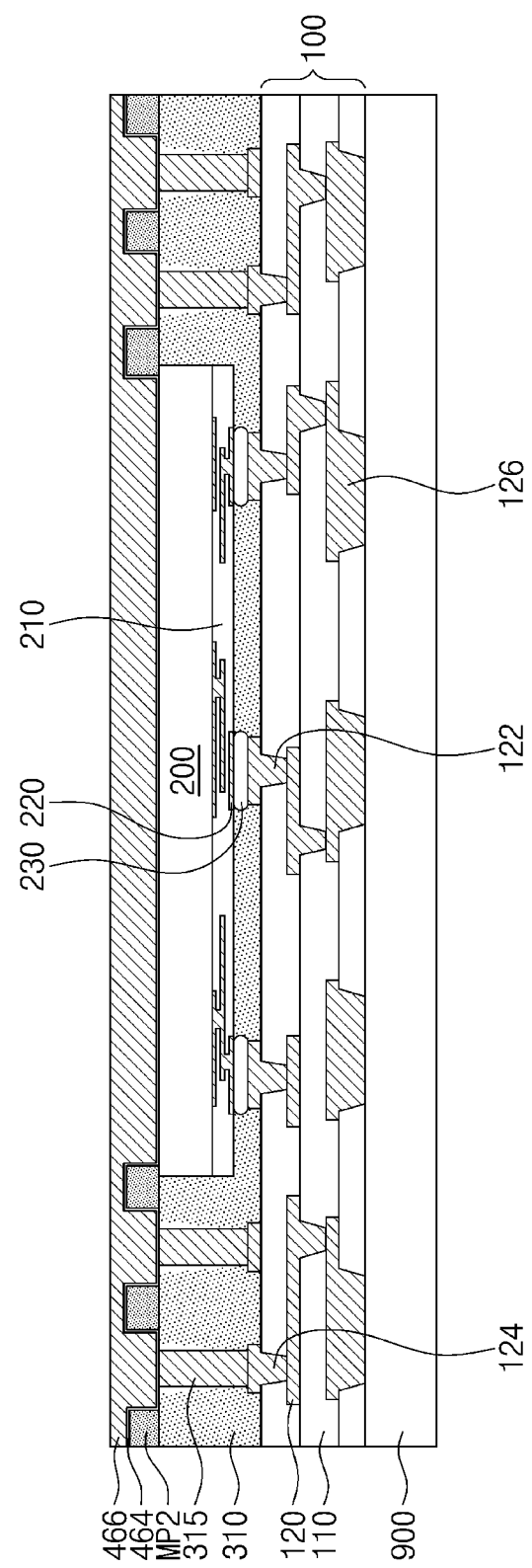

Referring to FIG. 20, a fourth seed/barrier layer 464 may be formed on the second mask pattern MP2. The fourth seed/barrier layer 464 may be formed to conformally cover a top surface of the second mask pattern MP2, an inner side surface and a bottom surface of the third hole h3, and an inner side surface and a bottom surface of the fourth hole h4.

A conductive layer 466 may be formed on the fourth seed/barrier layer 464. For example, a plating process, in which the fourth seed/barrier layer 464 is used as a seed layer, may be performed to form the conductive layer 466. The plating process may include an electro-plating process. The conductive layer 466 may be formed to cover the top surface of the second mask pattern MP2 and to fill inner spaces of the third and fourth holes h3 and h4. For example, the conductive layer 466 may be disposed on a top surface of the fourth seed/barrier layer 464, and, in the third and fourth holes h3 and h4, the conductive layer 466 may be formed on side surfaces and a bottom surface of the fourth seed/barrier layer 464.

Figure 21:
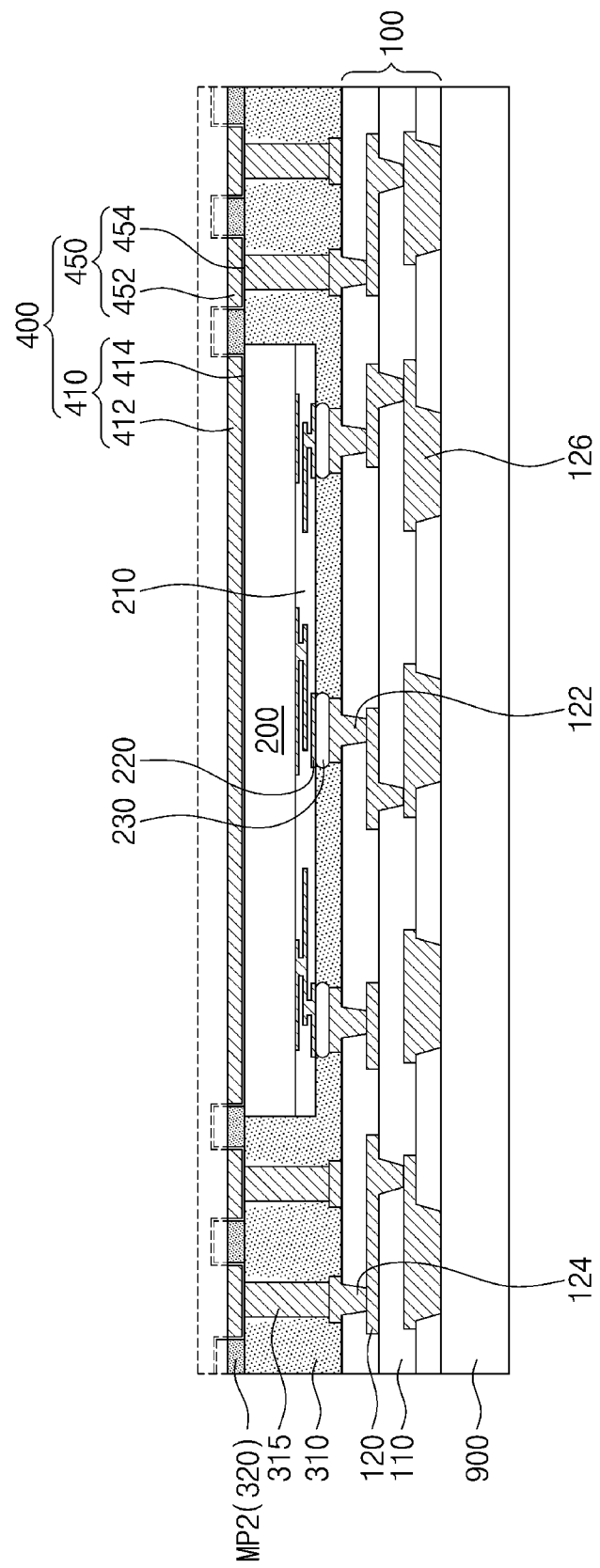

Referring to FIG. 21, the conductive layer 466 may be partially removed. For example, a thinning process may be performed on the conductive layer 466. For example, a grinding process or a chemical mechanical polishing (CMP) process may be performed on a top surface of the conductive layer 466. Thus, the conductive layer 466 may have a planarized or flat top surface. The thinning process may be performed until the top surface of the second mask pattern MP2 is exposed. In an example embodiment of the present inventive concept, an upper portion of the conductive layer 466 may be partially removed during the thinning process.

As a result of the thinning process, the conductive layer 466 may be divided into the first metal pattern 412 and the second metal pattern 452, and the fourth seed/barrier layer 464 may be divided into the first seed/barrier layer 414 and the second seed/barrier layer 454. The first metal pattern 412 may be a portion of the conductive layer 466, which remains in the third hole h3 after the thinning process, and the first seed/barrier layer 414 may be a portion of the fourth seed/barrier layer 464, which remains in the third hole h3 after the thinning process. The second metal pattern 452 may be a portion of the conductive layer 466, which remains in the fourth hole h4 after the thinning process, and the second seed/barrier layer 454 may be a portion of the fourth seed/barrier layer 464, which remains in the fourth hole h4 after the thinning process. The first metal pattern 412 and the first seed/barrier layer 414 may constitute the heat-dissipation pattern 410 described with reference to FIG. 3, and the second metal pattern 452 and the second seed/barrier layer 454 may constitute the connection pattern 450 described with reference to FIG. 3.

After the thinning process, the top surface of the second mask pattern MP2 may be exposed to the outside. In an example embodiment of the present inventive concept, if desirable, an upper portion of the second mask pattern MP2 may be partially removed during the thinning process. The second mask pattern MP2, which is left after, may be used as the second mold layer 320 described with reference to FIG. 3. The top surface of the second mold layer 320, the top surface of the heat-dissipation pattern 410, and the top surface of the connection pattern 450 may be substantially flat and may be substantially coplanar with each other. Hereinafter, the present inventive concept will be further described in more detail with reference to the embodiment of FIGS. 15 to 18.

Figure 22:
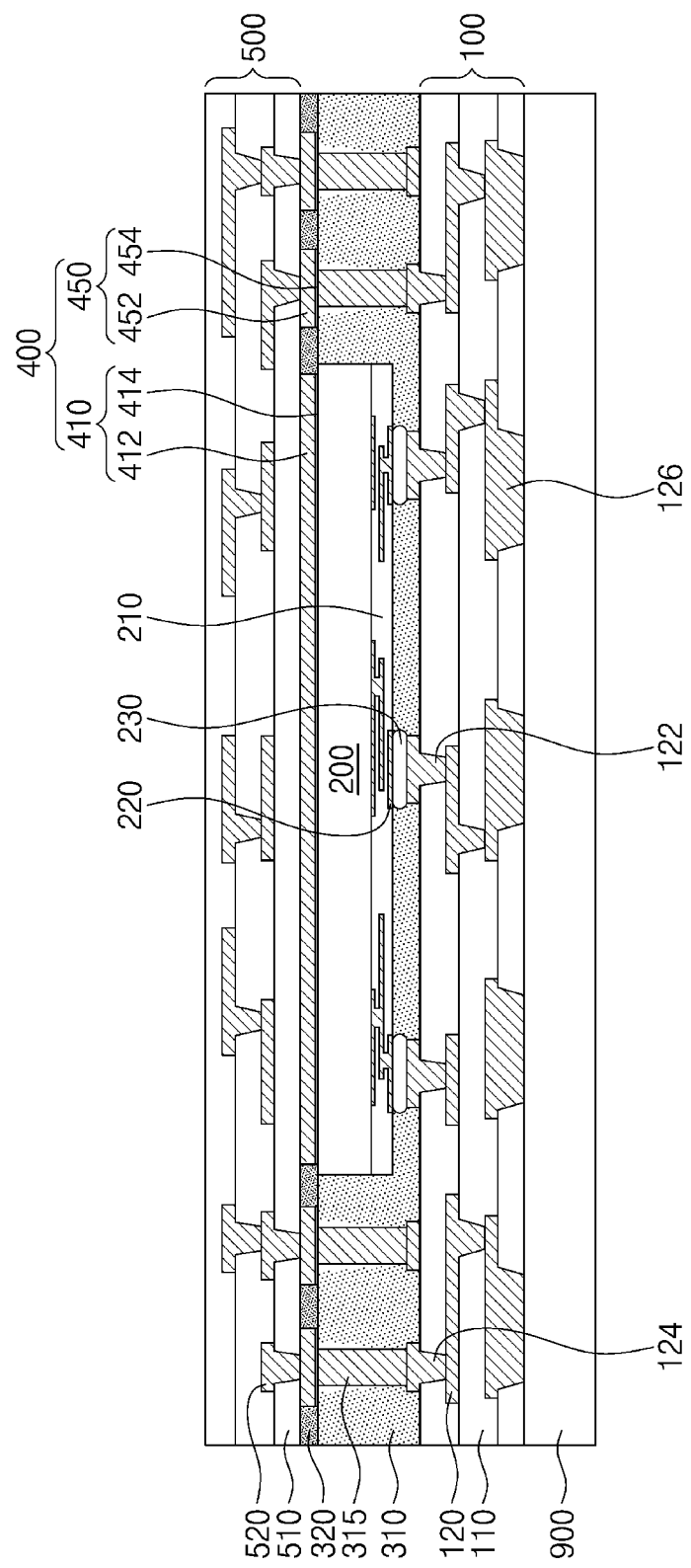

Referring to FIG. 22, the redistribution layer 500 may be formed on the structure of FIG. 18. For example, the second substrate insulating layer 510 may be formed on the second mold layer 320. The second substrate insulating layer 510 may be formed by coating an insulating material on the second mold layer 320 and curing the insulating material. The second substrate insulating layer 510 may be patterned to form openings. The openings may be formed to expose the top surface of the connection pattern 450. The second substrate interconnection pattern 520 may be formed on the second substrate insulating layer 510. As an example, the formation of the second substrate interconnection pattern 520 may include forming a seed/barrier layer on the top surface of the second substrate insulating layer 510, forming a mask pattern on the seed/barrier layer, and performing a plating process using the seed/barrier layer, which is exposed by the mask pattern, as a seed layer. Thereafter, the mask pattern and a portion of the seed/barrier layer, which is disposed below the mask pattern, may be removed. As a result of the afore-described process, a second substrate interconnection layer including the second substrate insulating layer 510 and the second substrate interconnection pattern 520 may be formed. The process of forming the second substrate interconnection layer may be repeated to form a plurality of the second substrate interconnection layers and thus form the redistribution layer 500.

Referring back to FIG. 1, the protection layer 102 may be formed on the bottom surface of the package substrate 100. For example, the carrier substrate 900 may be removed, and as a result, the bottom surface of the first substrate insulating layer 110 may be exposed to the outside. The protection layer 102 may be formed by depositing an insulating material on the bottom surface of the first substrate insulating layer 110. In an example embodiment of the present inventive concept, the insulating material may include, for example, silicon oxide (SiO), silicon nitride (SiN), silicon oxynitride (SiON), or insulating polymers. Thereafter, the protection layer 102 may be patterned to expose the bottom surface of the under-bump pads 126.

The outer terminals 105 may be provided on the bottom surface of the package substrate 100. For example, the outer terminals 105 may be disposed on the under-bump pads 126 that are exposed by the protection layer 102. The outer terminals 105 may include solder balls or solder bumps.

In a semiconductor package according to an example embodiment of the present inventive concept, heat, which is generated in a semiconductor chip, may be easily transferred to a redistribution layer through a heat-dissipation pattern, and thus, the semiconductor package may have increased heat-dissipation efficiency. In addition, the redistribution layer disposed on the semiconductor chip may be more robustly supported, and the heat-dissipation pattern may prevent an external stress or strain from being exerted on the semiconductor chip or may prevent the semiconductor chip from being damaged by an external impact. In other words, the semiconductor package may have increased structural stability. Furthermore, it may be possible to reduce a resistance between a penetration electrode and a connection pattern and reduce a resistance between a substrate interconnection pattern and a connection pattern and thereby to realize a semiconductor package with improved electric characteristics.

In a semiconductor package according to an example embodiment of the present inventive concept, an amount of a metallic material placed below a semiconductor chip may be similar to an amount of a metallic material placed above the semiconductor chip. Thus, a thermal expansion rate of an upper portion of a semiconductor package, which is placed above the semiconductor chip, may be equal or similar to a thermal expansion rate of a lower portion of the semiconductor package, which is placed below the semiconductor chip. Accordingly, it may be possible to reduce a warpage issue of a semiconductor package, which may be caused by heat generated during a process of fabricating or operating a semiconductor package.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor package comprising:
   a package substrate;
   a first semiconductor chip disposed on the package substrate;
   a heat-dissipation pattern disposed on the first semiconductor chip;
   a first mold layer disposed on the package substrate and at least partially surrounding the first semiconductor chip and the heat-dissipation pattern;
   a redistribution layer disposed on the first mold layer;
   a penetration electrode penetrating the first mold layer and coupled to the package substrate; and
   a connection pattern disposed on the penetration electrode, and connecting the redistribution layer to the penetration electrode,
   wherein a top surface of the heat-dissipation pattern and a top surface of the connection pattern are exposed by the first mold layer,
   wherein the heat-dissipation pattern comprises a first seed/barrier layer facing the first semiconductor chip, and the first seed/barrier layer has a top surface that is a portion of the top surface of the heat-dissipation pattern.

2. The semiconductor package of claim 1, wherein the heat-dissipation pattern and the connection pattern are in direct contact with the redistribution layer.

3. The semiconductor package of claim 1, wherein the first mold layer comprises:
   a second mold layer provided on the package substrate and at least partially surrounding the first semiconductor chip; and
   a third mold layer provided on the second mold layer and at least partially surrounding the heat-dissipation pattern and the connection pattern,
   wherein a top surface of the second mold layer is coplanar with a top surface of the first semiconductor chip, and
   a top surface of the third mold layer is coplanar with the top surface of the heat-dissipation pattern and the top surface of the connection pattern.

4. The semiconductor package of claim 1, wherein the heat-dissipation pattern and the connection pattern comprise the same metallic material.

5. The semiconductor package of claim 1, wherein a first width of the connection pattern is larger than a second width of the penetration electrode.

6. The semiconductor package of claim 1, wherein the heat-dissipation pattern includes one of:
   a plate-shaped pattern covering a top surface of the first semiconductor chip;
   a mesh-shaped pattern disposed on the top surface of the first semiconductor chip and extended in a first direction and a second direction crossing the first direction;

line-shaped patterns extending in the first direction and arranged in the second direction on the top surface of the first semiconductor chip; or island-shaped patterns arranged in the first and second directions on the top surface of the first semiconductor chip.

7. The semiconductor package of claim 1, wherein a first thickness of the heat-dissipation pattern is substantially equal to a second thickness of the connection pattern.

8. The semiconductor package of claim 7, wherein the first thickness of the heat-dissipation pattern and the second thickness of the connection pattern ranges from about 1 μm to about 10 μm.

9. The semiconductor package of claim 1, wherein the connection pattern comprises a second seed/barrier layer facing the penetration electrode.

10. The semiconductor package of claim 1, further comprising:
a second semiconductor chip disposed on the redistribution layer; and
a fourth mold layer disposed on the redistribution layer and covering the second semiconductor chip.

11. A semiconductor package comprising:
a package substrate;
a first semiconductor chip disposed on the package substrate;
a redistribution layer disposed on the first semiconductor chip;
a first metal pattern disposed between the first semiconductor chip and the redistribution layer;
a first seed/barrier layer interposed between the first semiconductor chip and the first metal pattern;
a first mold layer disposed on the package substrate and at least partially surrounding the first semiconductor chip;
a second mold layer disposed on the first mold layer and at least partially surrounding the first metal pattern;
a vertical connection terminal provided at a side of the first semiconductor chip and penetrating the first mold layer and the second mold layer, wherein the vertical connection terminal connects the package substrate to the redistribution layer; and
outer terminals disposed on a bottom surface of the package substrate,
wherein a top surface of the first mold layer is coplanar with a top surface of the first semiconductor chip, and a top surface of the second mold layer is coplanar with a top surface of the first metal pattern,
wherein a top surface of the first seed/barrier layer is coplanar with the top surface of the first metal pattern.

12. The semiconductor package of claim 11, wherein the vertical connection terminal comprises:
a penetration electrode vertically penetrating the first mold layer and coupled to the package substrate;
a second metal pattern vertically penetrating the second mold layer and connecting the redistribution layer to the penetration electrode; and
a second seed/barrier layer interposed between a bottom surface of the second metal pattern and a top surface of the penetration electrode.

13. The semiconductor package of claim 12, wherein a first width of the second metal pattern is larger than a second width of the penetration electrode.

14. The semiconductor package of claim 12, wherein the first metal pattern and the second metal pattern comprise the same metallic material.

15. The semiconductor package of claim 12, wherein a first thickness of the first metal pattern is substantially equal to a second thickness of the second metal pattern.

16. The semiconductor package of claim 11, wherein the first metal pattern includes one of:
a plate-shaped pattern covering the top surface of the first semiconductor chip;
a mesh-shaped pattern disposed on the top surface of the first semiconductor chip and extended in a first direction and a second direction crossing the first direction;
line-shaped patterns extending in the first direction and arranged in the second direction on the top surface of the first semiconductor chip; or
island-shaped patterns arranged in the first and second directions on the top surface of the first semiconductor chip.

17. The semiconductor package of claim 11, further comprising:
a second semiconductor chip disposed on the redistribution layer; and
a third mold layer disposed on the redistribution layer and covering the second semiconductor chip.

18. A method of fabricating a semiconductor package, the method comprising:
mounting a semiconductor chip on a package substrate;
forming a penetration electrode on the package substrate;
forming a first mold layer on the package substrate, the semiconductor chip, and the penetration electrode;
performing a first planarization process on the first mold layer such that a first surface of the semiconductor chip and a first surface of the penetration electrode are exposed;
forming a first seed/barrier layer on the semiconductor chip;
forming a metal pattern on the first mold layer, wherein the metal pattern comprises a heat-dissipation pattern and a connection pattern, wherein the heat-dissipation pattern is placed on the first surface of the semiconductor chip, and the connection pattern is placed on the penetration electrode, wherein the heat-dissipation pattern comprises the first seed/barrier layer, wherein a top surface of the first seed/barrier layer is a portion of a top surface of the heat-dissipation pattern;
forming a second mold layer on the first mold layer, the heat-dissipation pattern and the connection pattern;
performing a second planarization process on the second mold layer such that a first surface of the heat-dissipation pattern and a first surface of the connection pattern are exposed; and
forming a redistribution layer, which is coupled to the connection pattern, on the second mold layer.

19. The method of claim 18, wherein the forming of the metal pattern comprises:
forming a photoresist layer on the first mold layer;
patterning the photoresist layer to form a first hole and a second hole, wherein the first hole exposes the first surface of the semiconductor chip, and the second hole exposes the first surface of the penetration electrode; and
filling the first hole and the second hole with a conductive material to form the heat-dissipation pattern and the connection pattern.

20. The method of claim 19, wherein the entirety of the first hole overlaps a portion of the first surface of the semiconductor chip, and the second hole overlaps the entirety of the first surface of the penetration electrode.

* * * * *